US007211851B2

(12) United States Patent
Miyakawa et al.

(10) Patent No.: US 7,211,851 B2
(45) Date of Patent: May 1, 2007

(54) FERROELECTRIC MEMORY

(75) Inventors: Tadashi Miyakawa, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 11/084,150

(22) Filed: Mar. 21, 2005

(65) Prior Publication Data
US 2006/0138503 A1    Jun. 29, 2006

(30) Foreign Application Priority Data
Dec. 27, 2004   (JP) ............................. 2004-376600

(51) Int. Cl.
*H01L 29/94* (2006.01)

(52) U.S. Cl. ............... 257/295; 257/295; 257/E29.164; 257/E29.172; 365/117

(58) Field of Classification Search ................. 257/295, 257/E29.164, E29.172; 365/117
See application file for complete search history.

(56) References Cited

U.S. PATENT DOCUMENTS 5,903,492 A    5/1999   Takashima
6,091,622 A *  7/2000   Kang ........................ 365/145
6,094,370 A    7/2000   Takashima
6,320,782 B1   11/2001  Takashima
6,657,882 B2   12/2003  Takashima
6,826,072 B2   11/2004  Takashima

FOREIGN PATENT DOCUMENTS

JP    11-177036    7/1999

* cited by examiner

*Primary Examiner*—Andy Huynh
*Assistant Examiner*—Thinh T Nguyen
(74) *Attorney, Agent, or Firm*—Oblon, Spivak, McClelland, Maier & Neustadt, P.C.

(57) ABSTRACT

A ferroelectric memory comprises a first transistor connected between N1 and N2 nodes, a second transistor connected between the N2 node and an N3 node, a first transistor connected between P1 and P2 nodes, a second transistor connected between the P2 node and a P3 node, a first wiring formed in a first wiring layer to interconnect the N1 node and the P1 node, a second wiring formed in the first wiring layer to interconnect the N3 node and the P3 node, a third wiring formed in a second wiring layer different from the first wiring layer to interconnect the N2 node and the P2 node, a first capacitor whose first electrode is connected to the first wiring, and a second capacitor whose first electrode is connected to the second wiring. Second electrodes of the first and second capacitors are both connected to the N2 node or the P2 node.

5 Claims, 17 Drawing Sheets

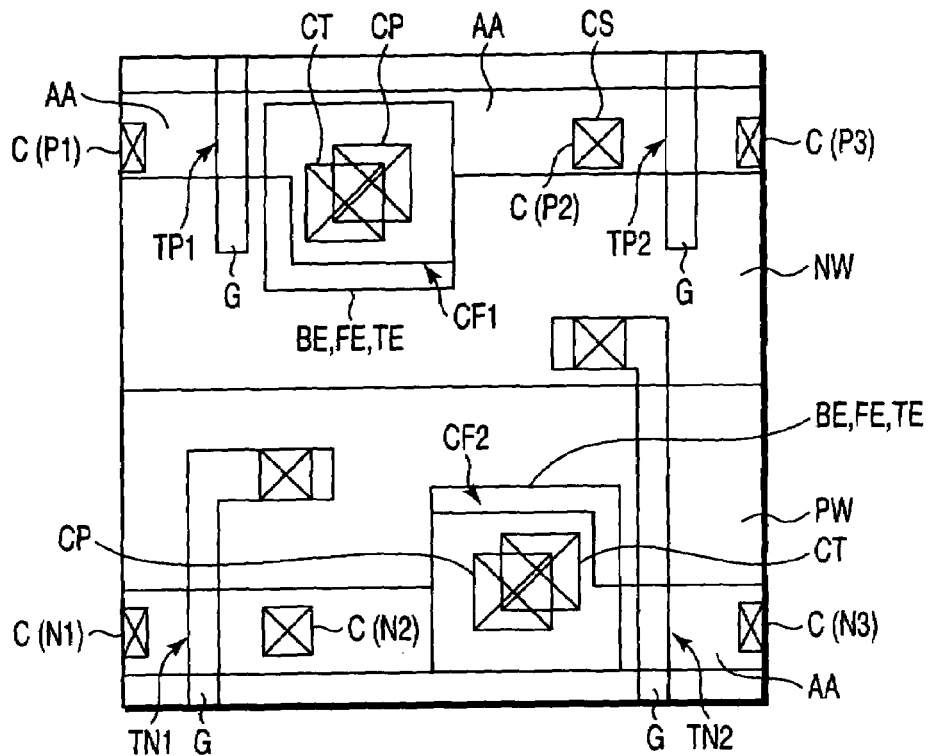
F I G. 10
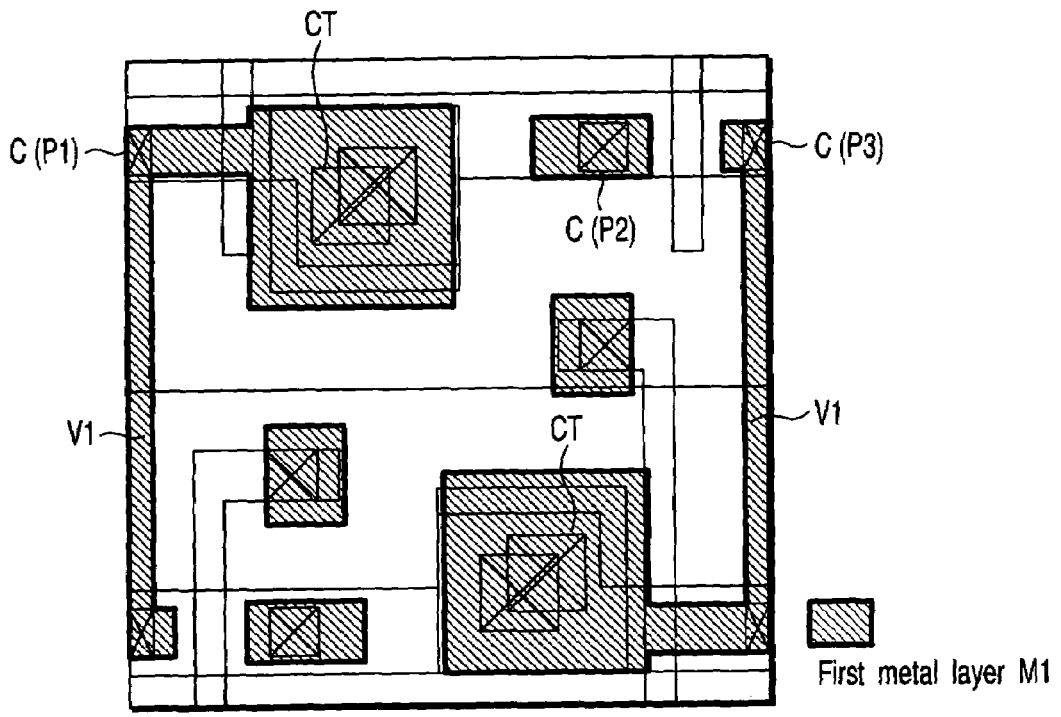
F I G. 11

FERROELECTRIC MEMORY

CROSS-REFERENCE TO RELATED APPLICATIONS

This application is based upon and claims the benefit of priority from prior Japanese Patent Application No. 2004-376600, filed Dec. 27, 2004, the entire contents of which are incorporated herein by reference.

BACKGROUND OF THE INVENTION

1. Field of the Invention

The present invention relates to a layout of memory cells of a ferroelectric memory.

2. Description of the Related Art

One of the cell array structures of a ferroelectric memory is a TC parallel unit serial connection type. This type has a structure in which a plurality of cell units constituted of parallely connected cell transistors (T) and capacitors (C). This structure is now a focus of attention as a structure capable of realizing a large memory capacity.

Recently, to meet a demand for a lower voltage of the ferroelectric memory, there has been proposed a CMOS type cell transistor in which a cell transistor comprises an N channel MOS transistor and a P channel MOS transistor (e.g., see Jpn. Pat. Appln. KOKAI Publication No. 11-177036).

In this case, however, an increase inevitably occurs in cell size because the cell transistor is the CMOS type.

BRIEF SUMMARY OF THE INVENTION

An aspect of the present invention is directed to a ferroelectric memory comprising a first N channel MOS transistor connected between N1 and N2 nodes; a second N channel MOS transistor connected between the N2 node and an N3 node; a first P channel MOS transistor connected between P1 and P2 nodes; a second P channel MOS transistor connected between the P2 node and a P3 node; a first wiring formed in a first wiring layer to interconnect the N1 node and the P1 node; a second wiring formed in the first wiring layer to interconnect the N3 node and the P3 node; a third wiring formed in a second wiring layer different from the first wiring layer to interconnect the N2 node and the P2 node; a first ferroelectric capacitor whose first electrode is connected to the first wiring; and a second ferroelectric capacitor whose first electrode is connected to the second wiring, wherein second electrodes of the first and second ferroelectric capacitors are both connected to the N2 node or the P2 node.

BRIEF DESCRIPTION OF THE SEVERAL VIEWS OF THE DRAWING

FIG. 10 is a plan diagram showing a layout of a cell unit according to the second embodiment;

FIG. 11 is a plan diagram showing a layout of a cell unit according to the second embodiment;

DETAILED DESCRIPTION OF THE INVENTION

A ferroelectric memory of an aspect of the present invention will be described below in detail with reference to the accompanying drawing.

1. Target Cell Array Structure

First, a cell array structure targeted by an example of the present invention will be described.

(1) Usual Cell Array Structure

Figure 1:
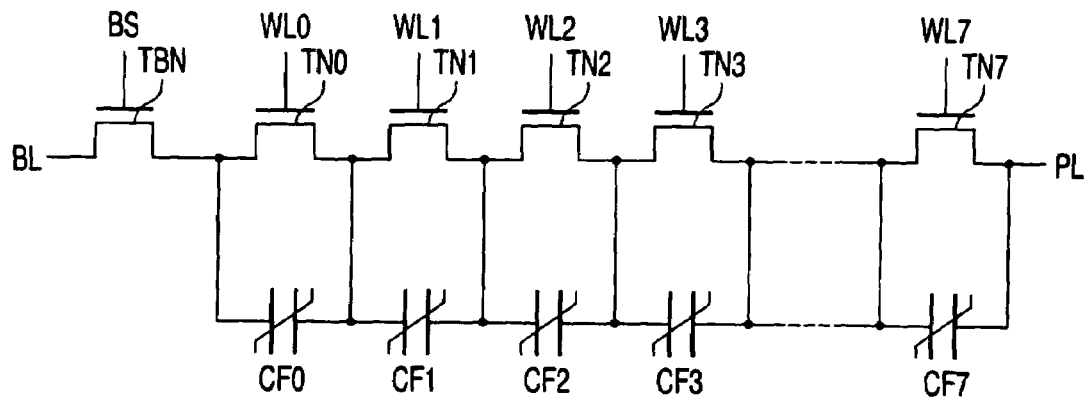
FIG. 1 is a circuit diagram showing one block of a TC parallel unit serial connection type ferroelectric memory.
Figure 2:
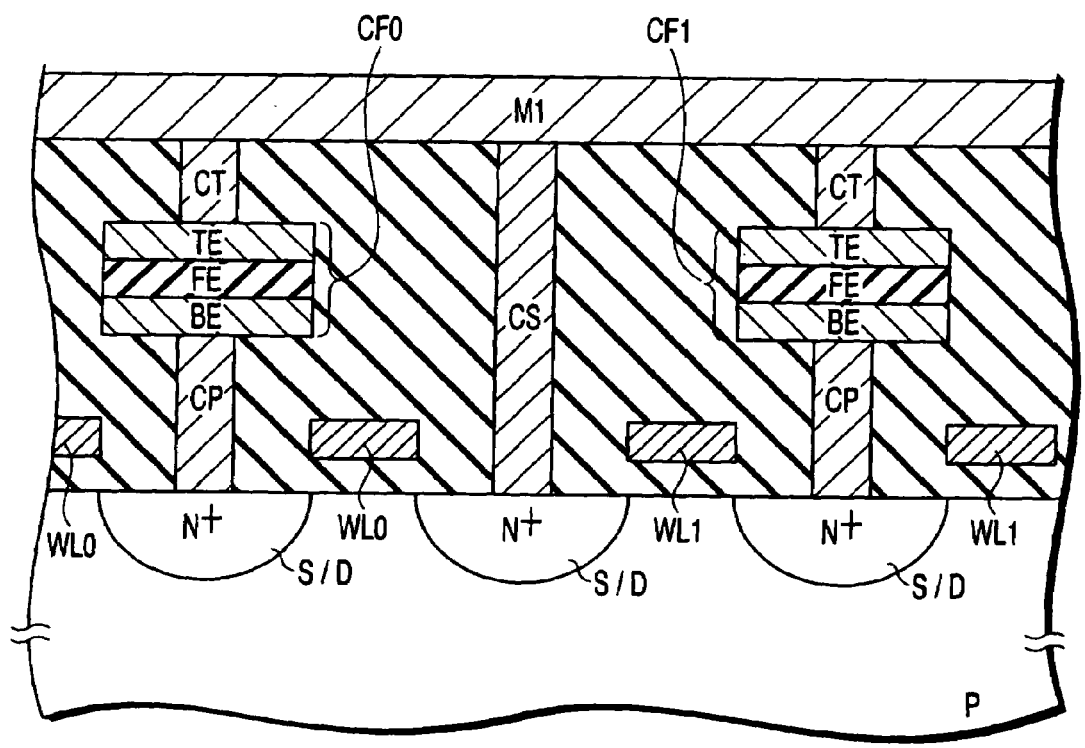
FIG. 2 is a sectional diagram showing a device structure of a cell unit of FIG. 1.

FIG. 1 shows one block of a usual TC parallel unit serial connection type ferroelectric memory. FIG. 2 shows an example a device structure of the block of FIG. 1.

In the usual TC parallel unit serial connection type ferroelectric memory, each of a plurality of cell units (TC parallel units) comprises N channel MOS transistors TNi (i=0, 1, . . . 7) and ferroelectric capacitors CFi.

Gates of the N channel MOS transistors TNi are connected to word lines WLi. A lower electrode BE of each of the ferroelectric capacitors CFi is connected through a contact plug CP to one of N+ diffusion layers S/D of the N channel MOS transistors TNi. An upper electrode TE is connected through a contact plug CT to a wiring M1. A ferroelectric FE is arranged between the lower and upper electrodes BE and TE.

The wiring M1 is electrically connected through a contact plug CS to the other of the N+ diffusion layers S/D of the N channel MOS transistors TNi.

One end of a unit row constituted of a plurality of serially connected cell units is connected to a plate line PL, and the other end is connected to a bit line BL through a block selection N channel MOS transistor TBN. A gate of the block selection N channel MOS transistor TBN is connected to a block selection signal line BS.

Incidentally, during data reading, after a selected word line is set at an L level and an unselected word line is set at an H level, the block selection signal line BS is set at an H level, and a pulse signal changed from an L level to an H level is supplied to the plate line PL.

Accordingly, data of a selected memory cell, i.e., data stored in the ferroelectric capacitor, is output to the bit line BL. If a potential change of the bit line BL is detected by a sense amplifier, the data of the selected memory cell can be determined.

At this time, however, the H level of the unselected word line must be set higher than potentials of the bit line BL and the plate line PL by a threshold voltage of the cell transistor (N channel MOS transistor) or more. Otherwise, a sufficient function (prevention of a reduction in transfer potential) of the cell transistor as a transfer gate cannot be exhibited. Simultaneously, a potential difference is generated between both ends of an unselected memory cell (ferroelectric capacitor) to cause data destruction.

Thus, in the usual ferroelectric memory, a high voltage is necessary for setting an H level of the unselected word line.

(2) Cell Array Structure Targeted by Example of the Invention

Figure 3:
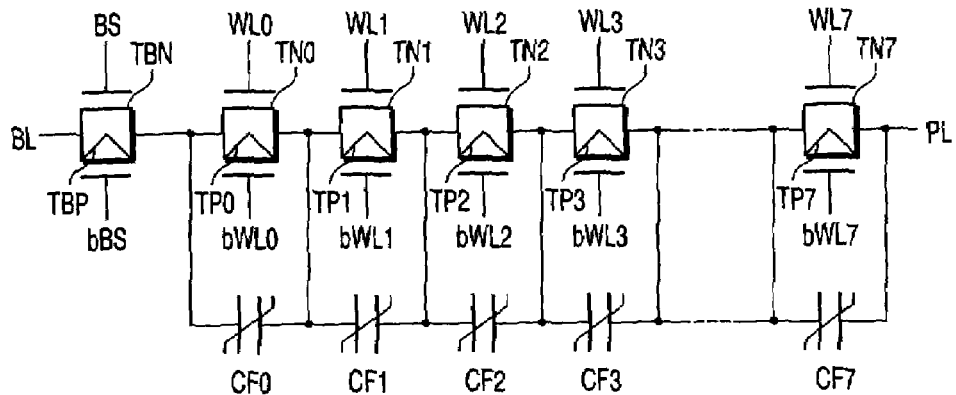
FIG. 3 is a circuit diagram showing one block of a ferroelectric memory targeted by an example of the invention.

FIG. 3 shows a block constituted of a plurality of cell units having CMOS type transistors targeted by an example of the invention.

A plurality (8 in the example) of cell units comprise N channel MOS transistors TNi (i=0, 1, . . . 7), P channel MOS transistors TPi, and ferroelectric capacitors CFi. The N channel MOS transistors TNi and the P channel MOS transistors TPi constitute CMOS type transfer gates, and the CMOS type transfer gates and the ferroelectric capacitors CFi are connected in parallel.

The plurality of cell units comprising the N channel MOS transistors TNi, the P channel MOS transistors TPi, and the ferroelectric capacitors CFi are serially connected. Gates of the N channel MOS transistors TNi are connected to word lines WLi, and gates of the P channel MOS transistors TPi are connected to word lines bWLi.

One end of a unit row constituted of a plurality of serially connected cell units is connected to a plate line PL, and the other end is connected to a bit line BL through a CMOS type transfer gate constituted of a block selection N channel MOS transistor TBN and a block selection P channel MOS transistor TBP.

A gate of the block selection N channel MOS transistor TBN is connected to a block selection signal BS, and a gate of the block selection P channel MOS transistor TBP is connected to a block selection signal line bBS.

During data reading, after a selected word line is set at an L level and an unselected word line is set at an H level, the block selection signal line BS is set at an H level, the block selection signal line bBS is set at an L level, and a pulse signal changed from an L level to an H level is supplied to the plate line PL.

Accordingly, data of a selected memory cell, i.e., data stored in the ferroelectric capacitor, is output to the bit line BL. If a potential change of the bit line BL is detected by a sense amplifier, the data of the selected memory cell can be determined.

2. Embodiments

Next, some preferred embodiments will be described.

(1) First Embodiment

Figure 4:
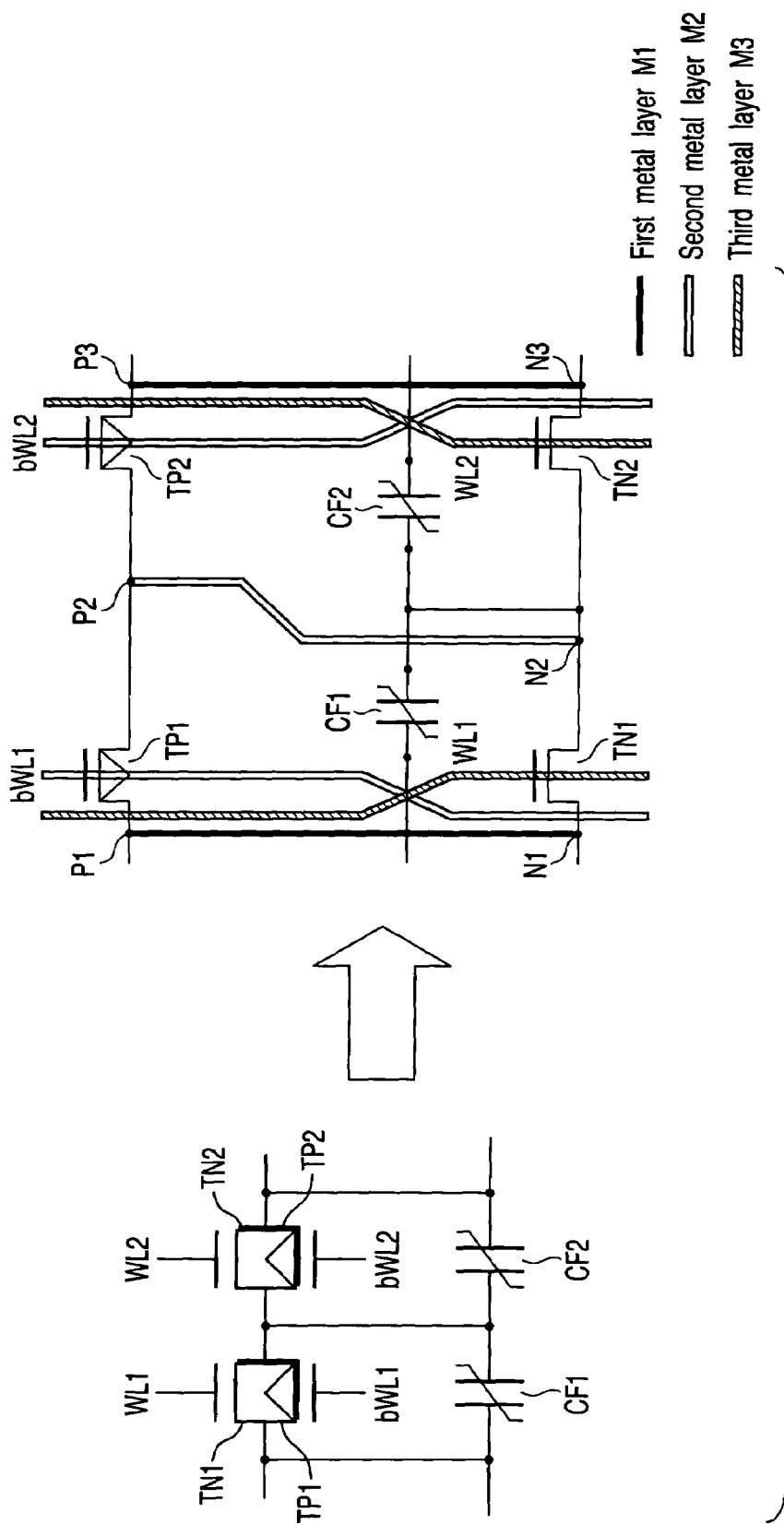
FIG. 4 is a circuit diagram showing an outline of a layout according to a first embodiment.

FIG. 4 shows an outline of a layout of memory cells of a TC parallel unit serial connection type ferroelectric memory according to a first embodiment.

The embodiment shows only two cell units (TC parallel units). However, when the number of cell units exceeds two, the same pattern is repeated. For example, nodes P3, N3 in the drawings are set to nodes P1, N1, and cell units can be increased one by one in order of nodes P1, N1→nodes P2, N2→nodes P3, N3.

A first cell unit comprises an N channel MOS transistor TN1, a P channel MOS transistor TP1, and a ferroelectric capacitor CF1. A second cell unit comprises an N channel MOS transistor TN2, a P channel MOS transistor TP2, and a ferroelectric capacitor CF2.

The N channel MOS transistors TN1, TN2 are serially connected, and the P channel MOS transistors TP1, TP2 are serially connected.

One end of the N channel MOS transistor TN1 becomes a node N1 (N1 node), and the other end becomes a node N2 (N2 node). One end of the N channel MOS transistor TN2 becomes a node N2, and the other end becomes a node N3 (N3 node). One end of the P channel MOS transistor TP1 becomes a node P1 (P1 node), and the other end becomes a node P2 (P2 node). One end of the P channel MOS transistor TP2 becomes a node P2, and the other end becomes a node P3 (P3 node).

The nodes P1, N1 and one end of the ferroelectric capacitor CF1 are electrically connected to each other through a first metal layer (first wiring layer) M1. The nodes P3, N3 and one end of the ferroelectric capacitor CF2 are electrically connected to each other through the first metal layer M1. The other ends of the ferroelectric capacitors CF1, CF2 are electrically connected to each other, and connection points thereof are electrically connected to the node N2.

The nodes P2, N2 are electrically connected to each other through a second metal layer (second wiring layer) M2 on the first metal layer M1. Word lines bWL1, bWL2 are formed in the second metal layer M2. The word line bWL1 is connected to the gate of the P channel MOS transistor TP1, and the word line bWL2 is connected to the gate of the P channel MOS transistor TP2.

Word lines WL1, WL2 are formed in a third metal layer (third wiring layer) M3 on the second metal layer M2. The word line WL1 is connected to the gate of the N channel MOS transistor TN1, and the work line WL2 is connected to the gate of the N channel MOS transistor TN2.

According to the embodiment, the other ends of the ferroelectric capacitors CF1, CF2 are connected to the node N2, i.e., an N type diffusion layer of the N channel MOS transistors TN1, TN2. Instead, however, it may be connected to the node P2, i.e., a P type diffusion layer of the P channel MOS transistors TP1, TP2.

According to the embodiment, the word lines bWL1, bWL2 are formed in the second metal layer M2, and the word lines WL1, WL2 are formed in the third metal layer M3. Instead, however, the word lines WL1, WL2 may be formed in the second metal layer M2, and the word lines bWL1, bWL2 may be formed in the third metal layer M3.

FIGS. 5 to 8 show layouts when the circuit diagram of FIG. 4 is realized on a semiconductor substrate.

FIGS. 5 to 8 show the same portion which is divided for each wiring layer to facilitate understanding of the layouts of the memory cells of the embodiment.

Figure 5:
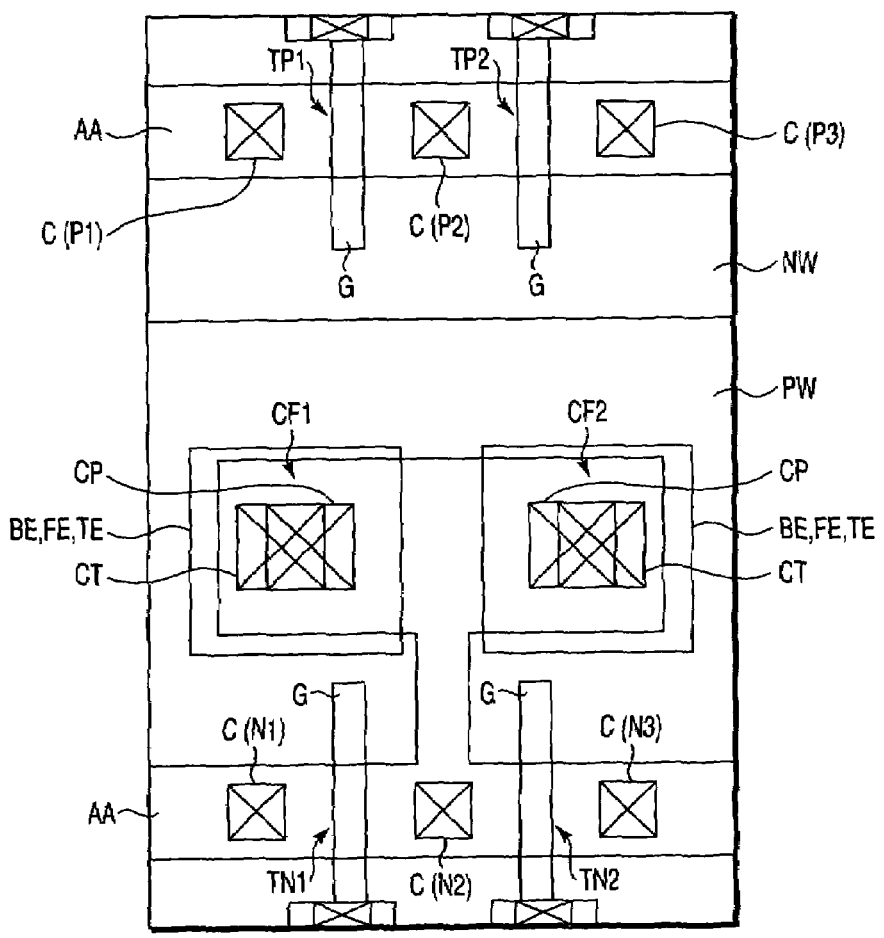
FIG. 5 is a plan diagram showing a layout of a cell unit according to the first embodiment.

To begin with, a layout in a state in which a polysilicon layer is formed as a gate of a MOS transistor is as shown in FIG. 5.

An N well region NW and a P well region PW are formed on a semiconductor substrate. The N and P well regions NW and PW are divided into element areas (active areas) AA and other element separation areas.

In the element area AA, the N channel MOS transistors TN1, TN2, and the P channel MOS transistors TP1, TP2 are formed.

The N channel MOS transistors TN1, TN2 comprise an N type diffusion layer and gate electrodes G formed in the element area AA. Contact plugs C(N1), C(N2) and C(N3) are formed on the N type diffusion layer. It is to be noted that N1, N2 and N3 in the brackets of the C(N1), the C(N2) and the C(N3) correspond to the nodes N1, N2 and N3 in FIG. 4.

The P channel MOS transistor TP1, TP2 comprise a P type diffusion layer and gate electrodes G formed in the element area AA. Contact plugs C(P1), C(P2) and C(P3) are formed on the P type diffusion layer. It is to be noted that P1, P2 and P3 in the brackets of the C(P1), the C(P2) and the C(P3) correspond to the nodes P1, P2 and P3 in FIG. 4.

The gate electrode G comprises a conductive polysilicon layer containing impurities.

Each of the ferroelectric capacitors CF1, CF2 comprises a lower electrode BE, an upper electrode TE, and a ferroelectric FE arranged therebetween.

The lower electrode BE of each of the ferroelectric capacitors CF1, CF2 is connected through the contact plug CP to the N type diffusion layer in the element area AA. On the upper electrode TE of each of the ferroelectric capacitors CF1, CF2, a contact plug CT is formed to contact the first metal layer Ml (described later).

Figure 6:
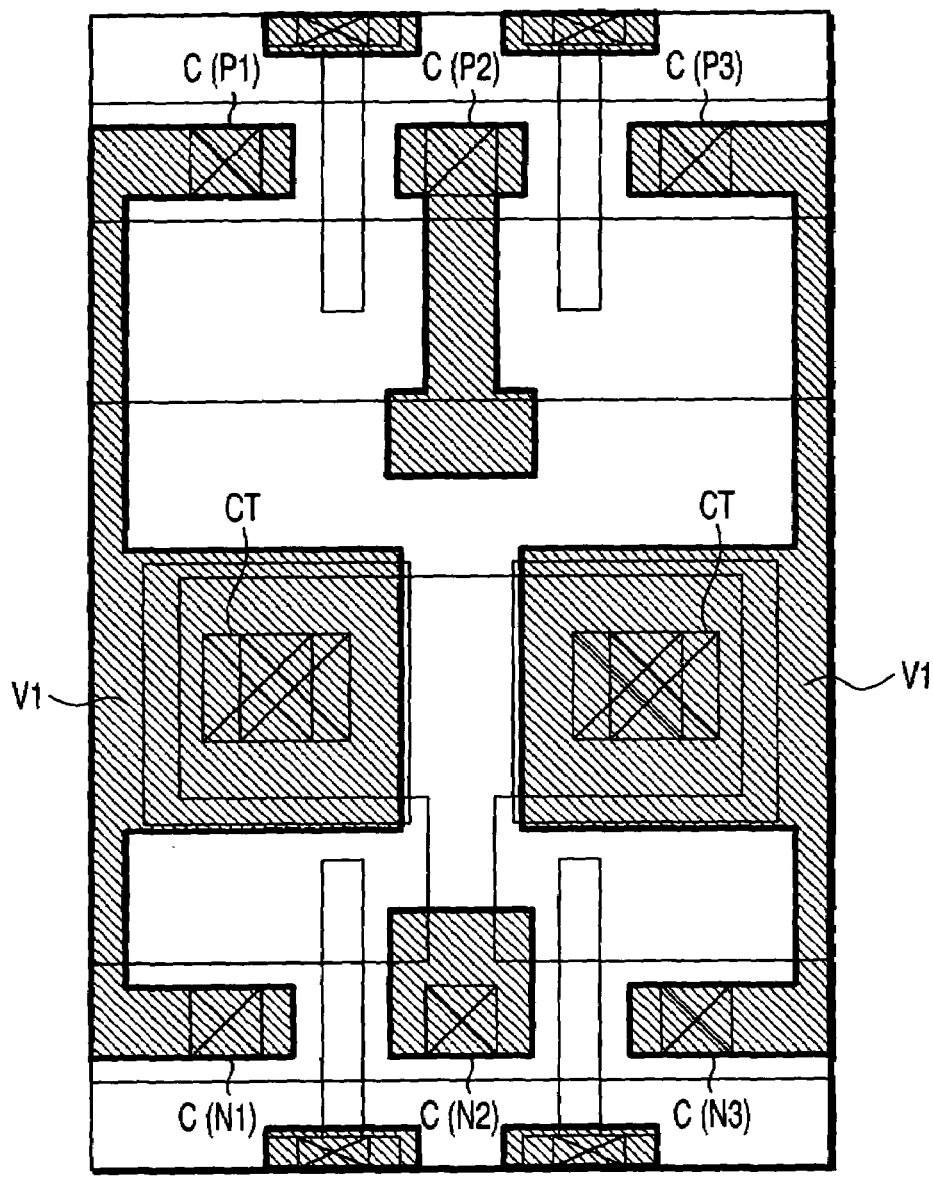
FIG. 6 is a plan diagram showing a layout of a cell unit according to the first embodiment.

The first metal layer M1 is formed on the layout of FIG. 5. A layout of the first metal layer M1 is as shown in FIG. 6.

In the first metal layer M1, a wiring V1 for electrically interconnecting the contact plugs C(P1), C(N1) and CT and a wiring V1 for electrically interconnecting the contact plugs C(P3), C(N3) and CT are formed. Additionally, in the first metal layer M1, an intermediate layer connected to the gate electrode G and an intermediate layer connected to the contact plugs C(N2), C(P2) are formed.

Figure 7:
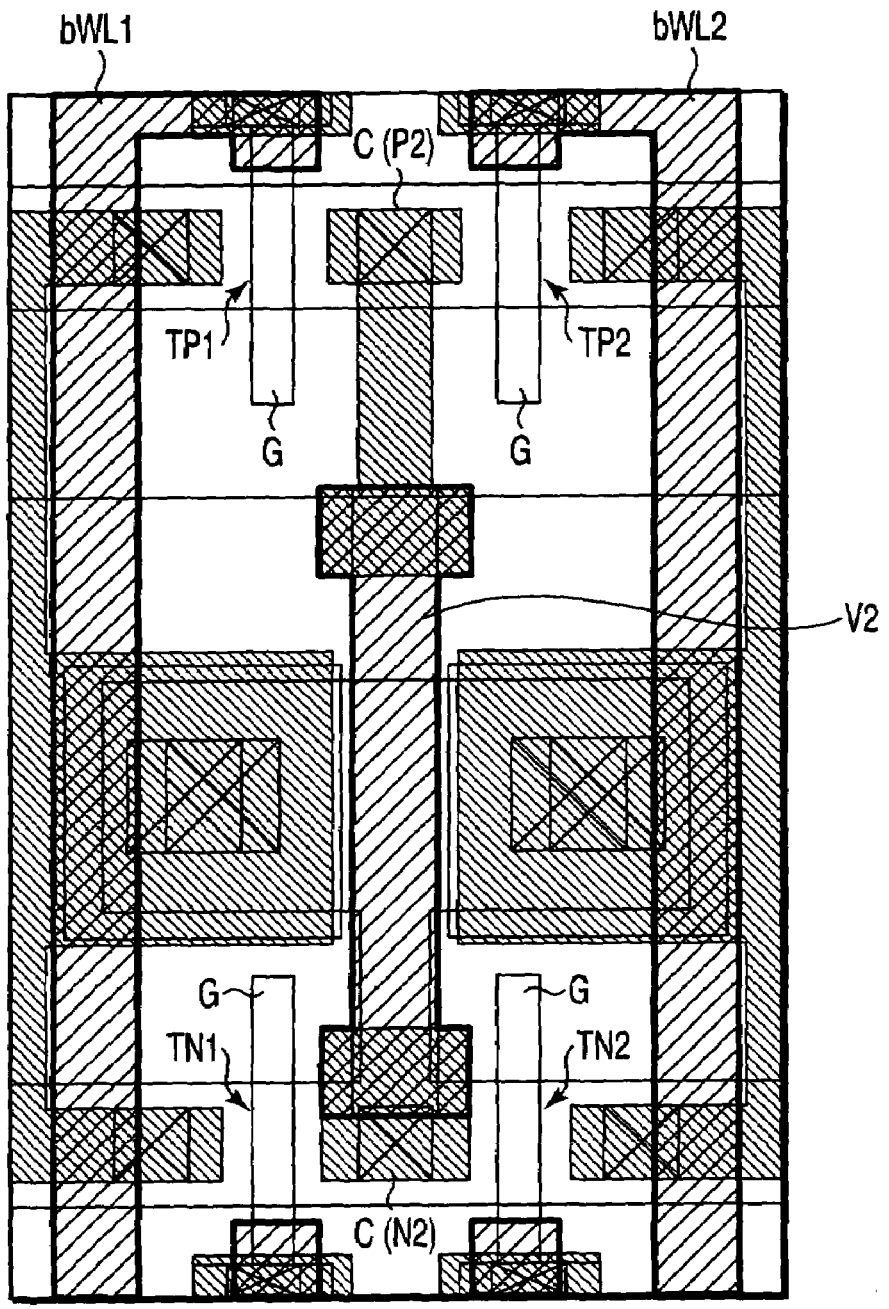
FIG. 7 is a plan diagram showing a layout of a cell unit according to the first embodiment.

The second metal layer M2 is formed on the first metal layer M1. A layout of the second metal layer M2 is as shown in FIG. 7.

In the second metal layer M2, the word lines bWL1, bWL2 are formed. The word line bWL1 is connected to the gate electrode G of the P channel MOS transistor TP1, and the word line bWL2 is connected to the gate electrode G of the P channel MOS transistor TP2. In the second metal layer M2, a wiring V2 for electrically interconnecting the contact plugs C(P2), C(N2), a wiring V2 for electrically interconnecting the contact plugs C(P2), C(N2), and an intermediate layer connected to the gate electrodes G of the N channel MOS transistors TN1, TN2 are formed.

Figure 8:
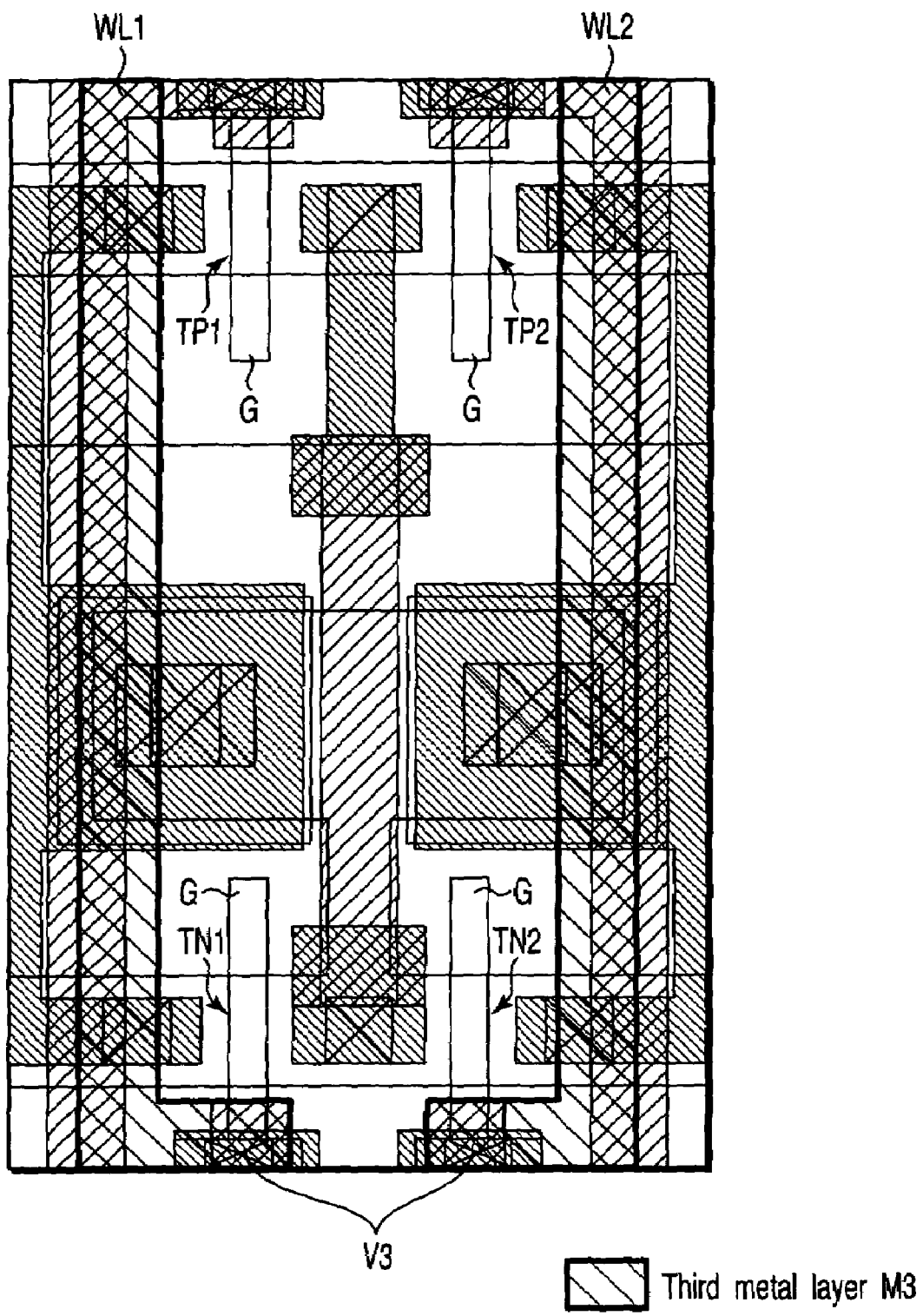
FIG. 8 is a plan diagram showing a layout of a cell unit according to the first embodiment.

The third metal layer M3 is formed on the second metal layer M2. A layout of the third metal layer M3 is as shown in FIG. 8.

The word lines WL1, WL2 are formed in the third metal layer M3. The word line WL1 is connected to the gate electrode G of the N channel MOS transistor TN1, and the word line WL2 is connected to the gate electrode G of the N channel MOS transistor TN2.

Four layouts constituted of the foregoing two types of cell units are serially arrayed to form eight cell units. Thus, a TC parallel unit serial connection type ferroelectric memory having a CMOS type cell transistor similar to that shown in FIG. 3 can be provided.

As described above, in the layout of the first embodiment, the plurality of serially connected N channel MOS transistors TNi and the plurality of serially connected P channel MOS transistors TPi are arranged side by side, and the plurality of serially connected ferroelectric capacitors CFi are arranged therebetween. The CMOS type cell transistor and the ferroelectric capacitor in the cell unit are electrically connected to each other through the first and second metal layers M1, M2, and the word lines WLi, bWLi are formed in the second and third metal layers M2, M3.

Thus, it is possible to realize a TC parallel unit serial connection type ferroelectric memory having a CMOS type cell transistor in which a cell size increase is limited to a minimum.

(2) Second Embodiment

Figure 9:
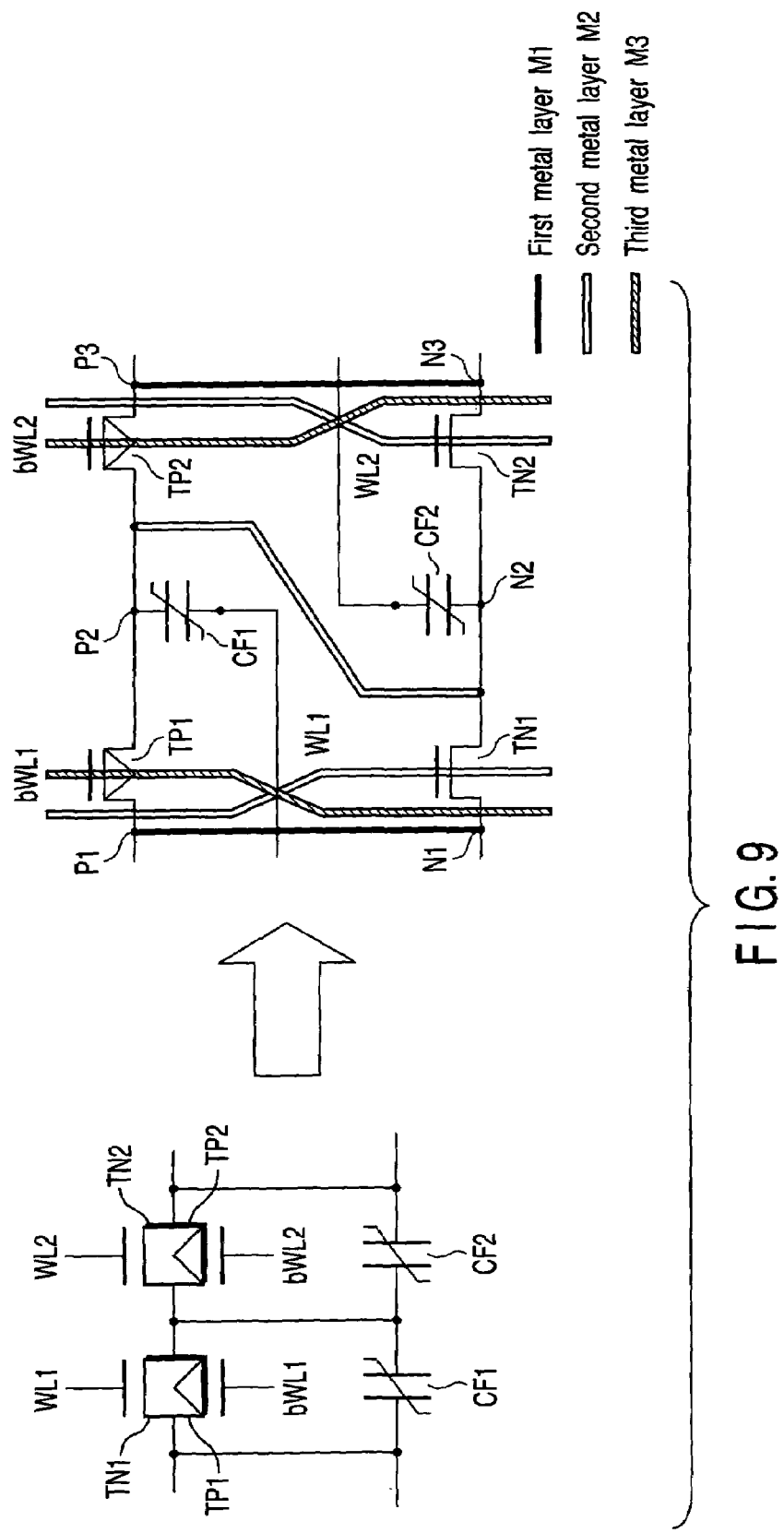
FIG. 9 is a circuit diagram showing an outline of a layout according to a second embodiment.

FIG. 9 shows an outline of a layout of memory cells of a TC parallel unit serial connection type ferroelectric memory according to a second embodiment.

The embodiment shows only two cell units (TC parallel units). However, when the number of cell units exceeds two, the same pattern is repeated. For example, nodes P3, N3 in the drawings are set to nodes P1, N1, and cell units can be increased one by one in order of nodes P1, N1→nodes P2, N2→nodes P3, N3.

A first cell unit comprises an N channel MOS transistor TN1, a P channel MOS transistor TP1, and a ferroelectric capacitor CF1. A second cell unit comprises an N channel MOS transistor TN2, a P channel MOS transistor TP2, and a ferroelectric capacitor CF2.

The N channel MOS transistors TN1, TN2 are serially connected, and the P channel MOS transistors TP1, TP2 are serially connected.

One end of the N channel MOS transistor TN1 becomes a node N1 (N1 node), and the other end becomes a node N2 (N2 node). One end of the N channel MOS transistor TN2 becomes a node N2, and the other end becomes a node N3 (N3 node). One end of the P channel MOS transistor TP1 becomes a node P1 (P1 node), and the other end becomes a node P2 (P2 node). One end of the P channel MOS transistor TP2 becomes a node P2, and the other end becomes a node P3 (P3 node).

The nodes P1, N1 and one end of the ferroelectric capacitor CF1 are electrically connected to each other through a first metal layer (first wiring layer) M1. The nodes P3, N3 and one end of the ferroelectric capacitor CF2 are electrically connected to each other through the first metal layer M1. The other end of the ferroelectric capacitor CF1 is electrically connected to the node P2, and the other end of the ferroelectric capacitor CF2 is electrically connected to the node N2.

The nodes P2, N2 are electrically connected to each other through a second metal layer (second wiring layer) M2 on the first metal layer M1. Word lines WL1, WL2 are formed in the second metal layer M2. The word line WL1 is connected to the gate of the N channel MOS transistor TN1, and the word line WL2 is connected to the gate of the N channel MOS transistor TN2.

Word lines bWL1, bWL2 are formed in a third metal layer (third wiring layer) M3 on the second metal layer M2. The word line bWL1 is connected to the gate of the P channel MOS transistor TP1, and the work line bWL2 is connected to the gate of the P channel MOS transistor TP2.

According to the embodiment, the other end of the ferroelectric capacitor CF1 is connected to the node P2, i.e., a P type diffusion layer of the P channel MOS transistors TP1, TP2. Instead, however, it may be connected to the node N2, i.e., an N type diffusion layer of the N channel MOS transistors TN1, TN2.

According to the embodiment, the other end of the ferroelectric capacitor CF2 is connected to the node N2, i.e., the N type diffusion layer of the N channel MOS transistors TN1, TN2. Instead, however, it may be connected to the node P2, i.e., the P type diffusion layer of the P channel MOS transistors TP1, TP2.

Furthermore, according to the embodiment, the word lines WL1, WL2 are formed in the second metal layer M2, and the word lines bWL1, bWL2 are formed in the third metal layer M3. Instead, however, the word lines bWL1, bWL2 may be formed in the second metal layer M2, and the word lines WL1, WL2 may be formed in the third metal layer M3.

FIGS. 10 to 13 show layouts when the circuit diagram of FIG. 9 is realized on a semiconductor substrate.

FIGS. 10 to 13 show the same portion which is divided for each wiring layer to facilitate understanding of the layouts of the memory cells of the embodiment.

To begin with, a layout in a state in which a polysilicon layer is formed as a gate of a MOS transistor is as shown in FIG. 10.

An N well region NW and a P well region PW are formed on a semiconductor substrate. The N and P well regions NW and PW are divided into element areas (active areas) AA and other element separation areas.

In the element area AA, the N channel MOS transistors TN1, TN2, and the P channel MOS transistors TP1, TP2 are formed.

The N channel MOS transistors TN1, TN2 comprise an N type diffusion layer and gate electrodes G formed in the element area AA. Contact plugs C(N1), C(N2) and C(N3) are formed on the N type diffusion layer. It is to be noted that N1, N2 and N3 in the brackets of the C(N1), the C(N2) and the C(N3) correspond to the nodes N1, N2 and N3 in FIG. 9.

The P channel MOS transistor TP1, TP2 comprise a P type diffusion layer and gate electrodes G formed in the element area AA. Contact plugs C(P1), C(P2) and C(P3) are formed on the P type diffusion layer. It is to be noted that P1, P2 and P3 in the brackets of the C(P1), the C(P2) and the C(P3) correspond to the nodes P1, P2 and P3 in FIG. 9.

The gate electrode G comprises a conductive polysilicon layer containing impurities.

Each of the ferroelectric capacitors CF1, CF2 comprises a lower electrode BE, an upper electrode TE, and a ferroelectric FE arranged therebetween.

The lower electrode BE of the ferroelectric capacitor CF1 is connected through the contact plug CP to the P type diffusion layer (node P2) in the element area AA. The lower electrode BE of the ferroelectric capacitor CF2 is connected through the contact plug CP to the N type diffusion layer (node N2) in the element area AA.

On the upper electrode TE of each of the ferroelectric capacitors CF1, CF2, a contact plug CT is formed to contact the first metal layer M1 (described later).

The first metal layer M1 is formed on the layout of FIG. 10. A layout of the first metal layer M1 is as shown in FIG. 11.

In the first metal layer M1, a wiring V1 for electrically interconnecting the contact plugs C(P1), C(N1) and CT and a wiring V1 for electrically interconnecting the contact plugs C(P3), C(N3) and CT are formed.

Additionally, in the first metal layer M1, an intermediate layer connected to the gate electrode G and an intermediate layer connected to the contact plugs C(N2), C(P2) are formed.

Figure 12:
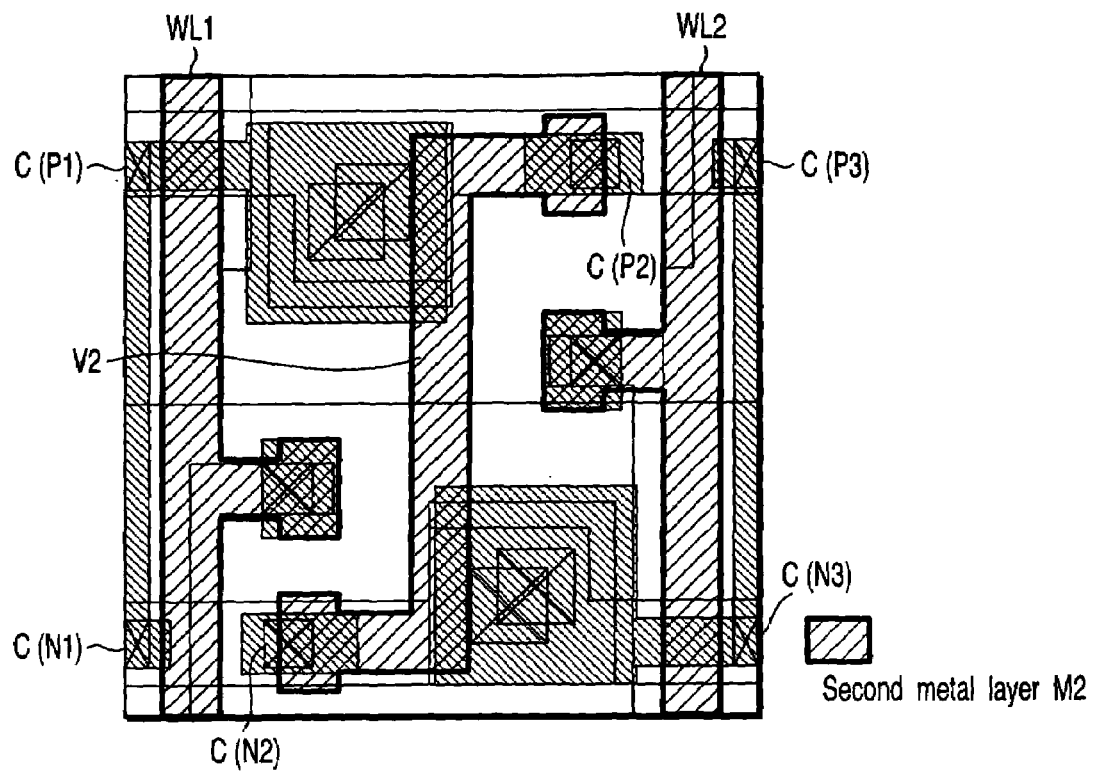
FIG. 12 is a plan diagram showing a layout of a cell unit according to the second embodiment.

The second metal layer M2 is formed on the first metal layer M1. A layout of the second metal layer M2 is as shown in FIG. 12.

In the second metal layer M2, the word lines WL1, WL2 are formed. The word line WL1 is connected to the gate electrode G of the N channel MOS transistor TN1, and the word line WL2 is connected to the gate electrode G of the N channel MOS transistor TN2. In the second metal layer M2, a wiring V2 for electrically interconnecting the contact plugs C(P2), C(N2) is formed.

Figure 13:
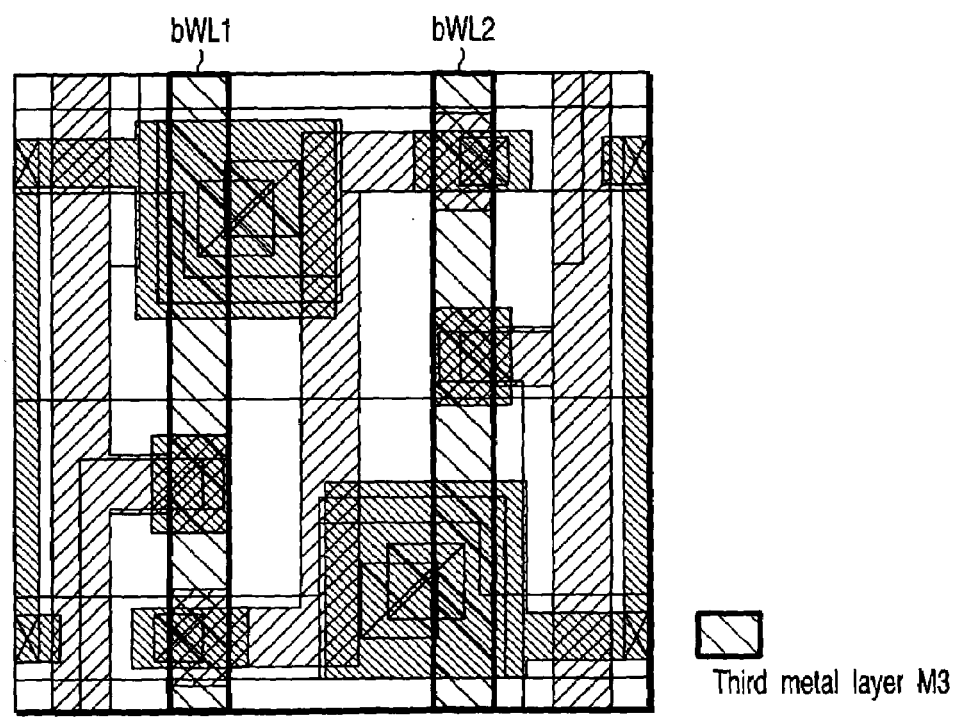
FIG. 13 is a plan diagram showing a layout of a cell unit according to the second embodiment.

The third metal layer M3 is formed on the second metal layer M2. A layout of the third metal layer M3 is as shown in FIG. 13.

The word lines bWL1, bWL2 are formed in the third metal layer M3. The word line bWL1 is connected to the gate electrode G of the P channel MOS transistor TP1, and the word line bWL2 is connected to the gate electrode G of the P channel MOS transistor TP2.

It is to be noted that the gates of the MOS transistors TN1, TN2, TP1, and TP2 are shared by the cells of a direction in which the word lines WL1, WL2, bWL1 and bWL2 are extended.

Accordingly, contact between the word lines WL1, WL2, bWL1 and bWL2 and the gates of the MOS transistors TN1, TN2, TP1 and TP2 only needs to be made in one of two adjacent blocks in the extended direction of the word lines WL1, WL2, bWL1 and bWL2.

Here, contact between the N channel MOS transistors TN1, TN2 is made in a block shown in FIG. 10. However, contact between the P channel MOS transistors TP1, TP2 is not shown because it is made in a block adjacent to the block shown in FIG. 10.

Four layouts constituted of the foregoing two types of cell units are serially arrayed to form eight cell units. Thus, a TC parallel unit serial connection type ferroelectric memory having a CMOS type cell transistor similar to that shown in FIG. 3 can be provided.

As described above, in the layout of the second embodiment, the first unit in which the P channel MOS transistors TPi and the ferroelectric capacitors CFi are connected in parallel and the second unit in which the N channel MOS transistors TNi and the ferroelectric capacitors CFi are connected in parallel are alternately arranged.

By using the first and second metal layers M1, M2, the N channel MOS transistors TNi are connected in parallel to the P channel MOS transistors TPi for the first unit, and the P channel MOS transistors TPi are connected in parallel to the N channel MOS transistors TNi for the second unit.

Furthermore, the word lines WLi, bWLi are formed in the second and third metal layers M2, M3.

Thus, it is possible to realize a TC parallel unit serial connection type ferroelectric memory having a CMOS type cell transistor in which a cell size increase is limited to a minimum.

(3) Third Embodiment

Figure 14:
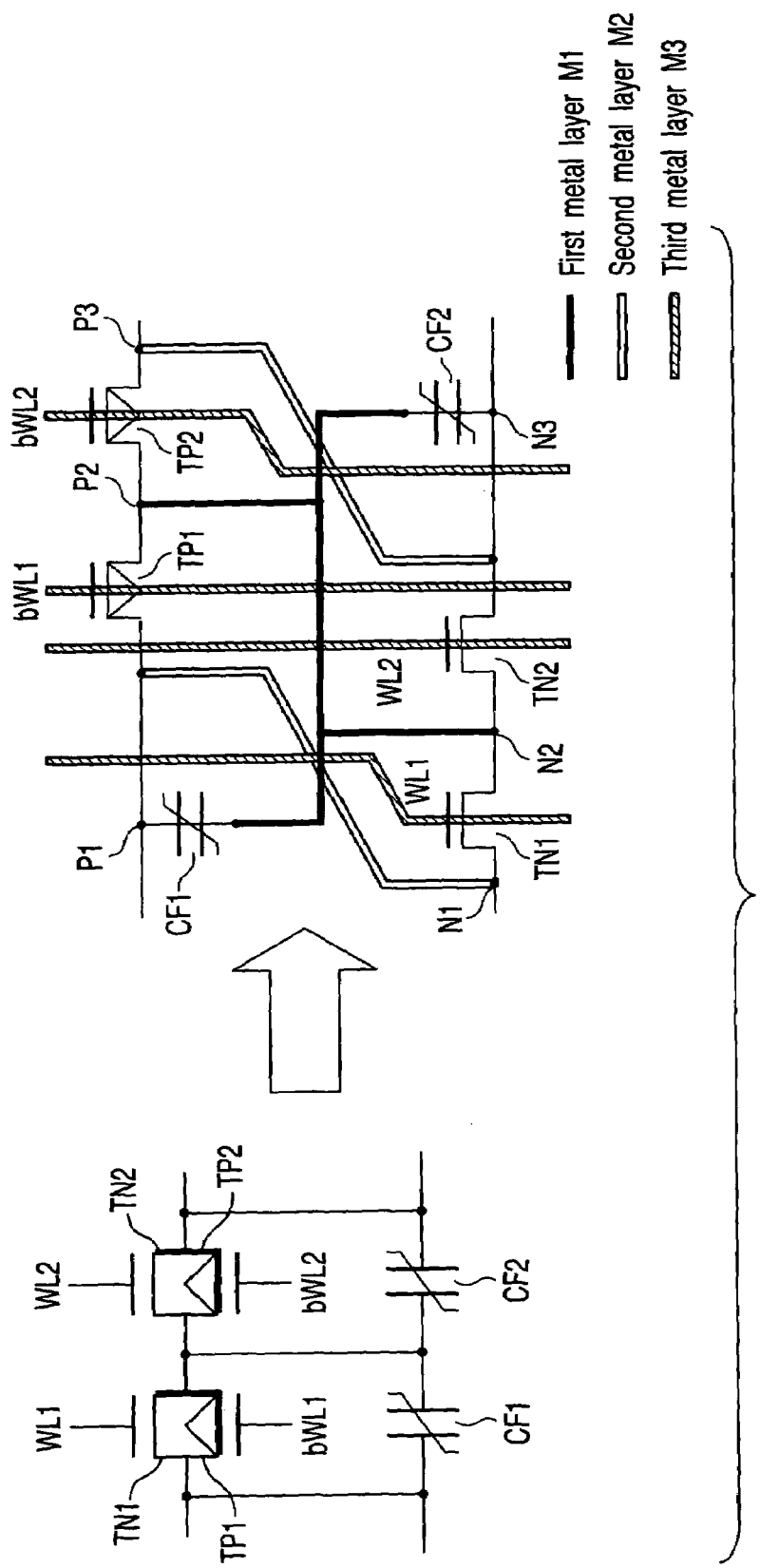
FIG. 14 is a circuit diagram showing an outline of a layout according to a third embodiment.

FIG. 14 shows an outline of a layout of memory cells of a TC parallel unit serial connection type ferroelectric memory according to a third embodiment.

The embodiment shows only two cell units (TC parallel units). However, when the number of cell units exceeds two, the same pattern is repeated. For example, nodes P3, N3 in the drawings are set to nodes P1, N1, and cell units can be increased one by one in order of nodes P1, N1→nodes P2, N2→nodes P3, N3.

A first cell unit comprises an N channel MOS transistor TN1, a P channel MOS transistor TP1, and a ferroelectric capacitor CF1. A second cell unit comprises an N channel MOS transistor TN2, a P channel MOS transistor TP2, and a ferroelectric capacitor CF2.

The N channel MOS transistors TN1, TN2 are serially connected, and the P channel MOS transistors TP1, TP2 are serially connected.

One end of the N channel MOS transistor TN1 becomes a node N1 (N1 node), and the other end becomes a node N2 (N2 node). One end of the N channel MOS transistor TN2 becomes a node N2, and the other end becomes a node N3 (N3 node). One end of the P channel MOS transistor TP1 becomes a node P1 (P1 node), and the other end becomes a node P2 (P2 node). One end of the P channel MOS transistor TP2 becomes a node P2, and the other end becomes a node P3 (P3 node).

The nodes P2, N2 and ends of the ferroelectric capacitors CF1, CF2 are electrically connected to each other through a first metal layer (first wiring layer) M1. The other end of the ferroelectric capacitor CF1 is electrically connected to the node P1, and the other end of the ferroelectric capacitor CF2 is electrically connected to the node N3.

The nodes P1, N1 are electrically connected to each other through a second metal layer (second wiring layer) M2 on the first metal layer M1. The nodes P3, N3 are electrically connected to each other through the second metal layer M2.

Word lines WL1, WL2, bWL1, and bWL2 are formed in a third metal layer M3. The word line WL1 is connected to a gate of the N channel MOS transistor TN1, and the word line WL2 is connected to a gate of the N channel MOS transistor TN2. The word line bWL1 is connected to a gate of the P channel MOS transistor TP1, and the work line bWL2 is connected to a gate of the P channel MOS transistor TP2.

According to the embodiment, the nodes P2, N2 and the ends of the ferroelectric capacitors CF1, CF2 are connected to each other through the first metal layer M1. Instead, however, they may be connected through the second metal layer M2. In this case, a wiring for interconnecting the nodes P1, N1 and a wiring for interconnecting the nodes P3, N3 are formed in the first metal layer M1.

According to the embodiment, the other end of the ferroelectric capacitor CF1 is electrically connected to the node P1, and the other end of the ferroelectric capacitor CF2 is electrically connected to the node N3. Instead, however, the other end of the ferroelectric capacitor CF1 may be electrically connected to the node N1, and the other end of the ferroelectric capacitor CF2 may be electrically connected to the node P3.

FIGS. 15 to 18 show layouts when the circuit diagram of FIG. 14 is realized on a semiconductor substrate.

FIGS. 15 to 18 show the same portion which is divided for each wiring layer to facilitate understanding of the layouts of the memory cells of the embodiment.

Figure 15:
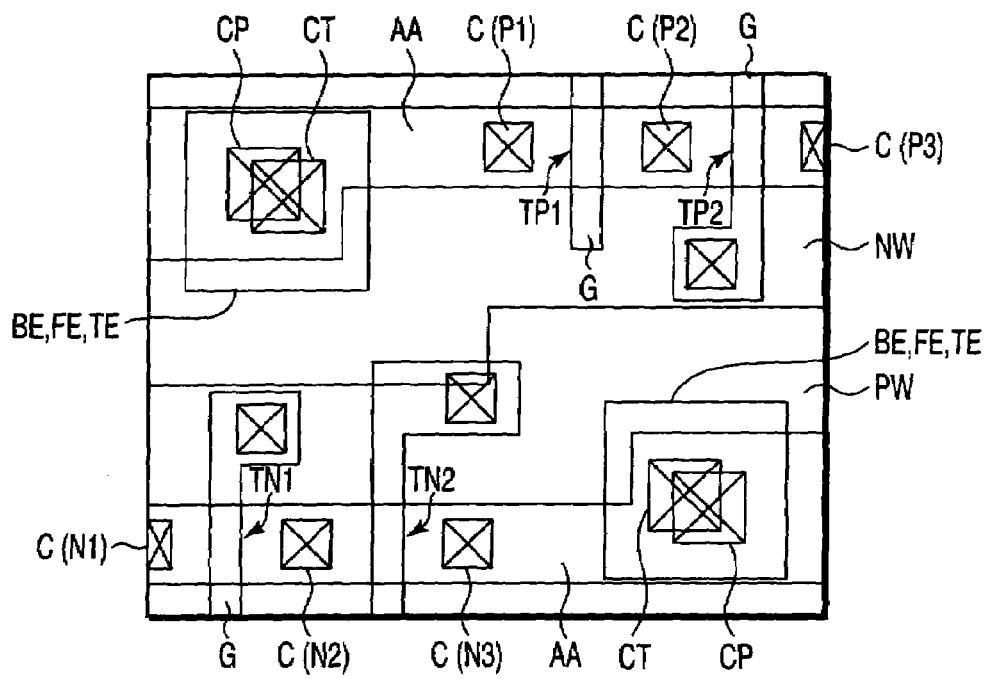
FIG. 15 is a plan diagram showing a layout of a cell unit according to the third embodiment.

To begin with, a layout in a state in which a polysilicon layer is formed as a gate of a MOS transistor is as shown in FIG. 15.

An N well region NW and a P well region PW are formed on a semiconductor substrate. The N and P well regions NW and PW are divided into element areas (active areas) AA and other element separation areas.

In the element area AA, the N channel MOS transistors TN1, TN2, and the P channel MOS transistors TP1, TP2 are formed.

The N channel MOS transistors TN1, TN2 comprise an N type diffusion layer and gate electrodes G formed in the element area AA. Contact plugs C(N1), C(N2) and C(N3) are formed on the N type diffusion layer. It is to be noted that N1, N2 and N3 in the brackets of the C(N1), the C(N2) and the C(N3) correspond to the nodes N1, N2 and N3 in FIG. 14.

The P channel MOS transistor TP1, TP2 comprise a P type diffusion layer and gate electrodes G formed in the element area AA. Contact plugs C(P1), C(P2) and C(P3) are formed on the P type diffusion layer. It is to be noted that P1, P2 and P3 in the brackets of the C(P1), the C(P2) and the C(P3) correspond to the nodes P1, P2 and P3 in FIG. 14.

The gate electrode G comprises a conductive polysilicon layer containing impurities.

Each of the ferroelectric capacitors CF1, CF2 comprises a lower electrode BE, an upper electrode TE, and a ferroelectric FE arranged therebetween.

The lower electrode BE of the ferroelectric capacitor CF1 is connected through the contact plug CP to the P type diffusion layer (node P1) in the element area AA. The lower electrode BE of the ferroelectric capacitor CF2 is connected through the contact plug CP to the N type diffusion layer (node N3) in the element area AA.

On the upper electrode TE of each of the ferroelectric capacitors CF1, CF2, a contact plug CT is formed to contact the first metal layer M1 (described later).

Figure 16:
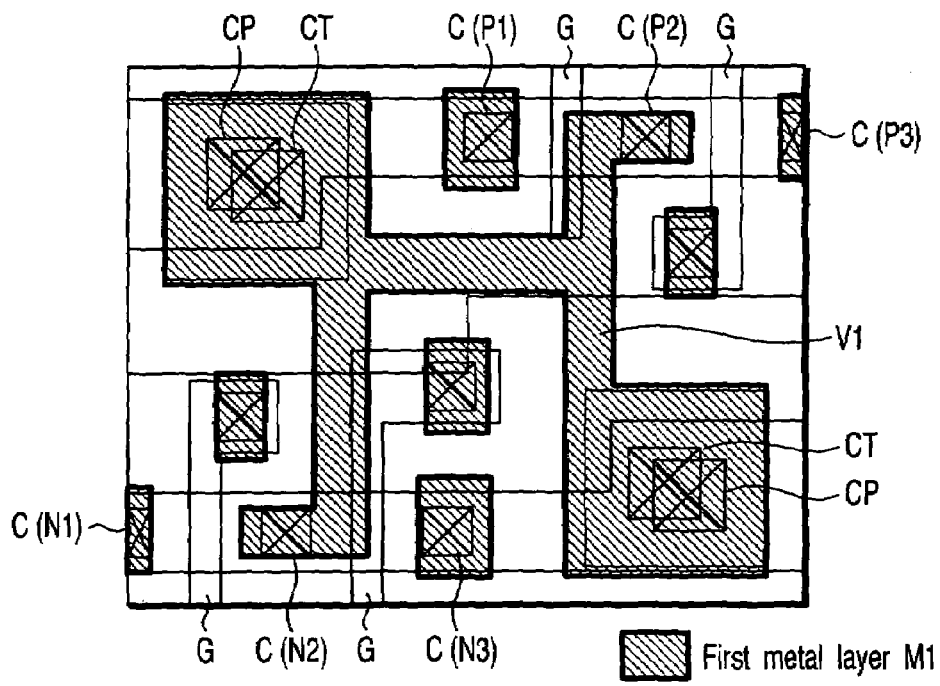
FIG. 16 is a plan diagram showing a layout of a cell unit according to the third embodiment.

The first metal layer M1 is formed on the layout of FIG. 15. A layout of the first metal layer M1 is as shown in FIG. 16.

In the first metal layer M1, a wiring V1 for electrically interconnecting the contact plugs C(P2), C(N2) and the contact plug CT connected to the ferroelectric capacitors CF1, CF2 is formed. Additionally, in the first metal layer M1, an intermediate layer connected to the gate electrode G and an intermediate layer connected to the contact plugs C(P1), C(P3), C(N1), and C(N3) are formed.

Figure 17:
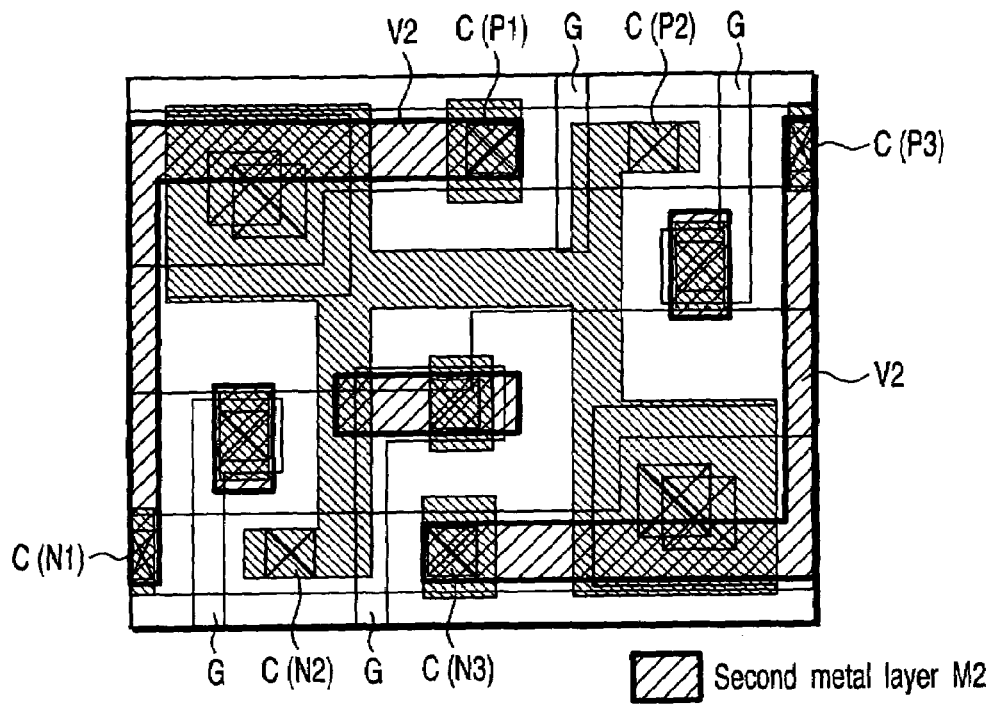
FIG. 17 is a plan diagram showing a layout of a cell unit according to the third embodiment.

The second metal layer M2 is formed on the first metal layer M1. A layout of the second metal layer M2 is as shown in FIG. 17.

In the second metal layer M2, a wiring V2 for electrically interconnecting the contact plugs C(P1), C(N1), and a wiring V2 for electrically interconnecting the contact plugs C(P3), C(N3) are formed. In the second metal layer M2, an intermediate layer connected to the gate electrode G is formed.

Figure 18:
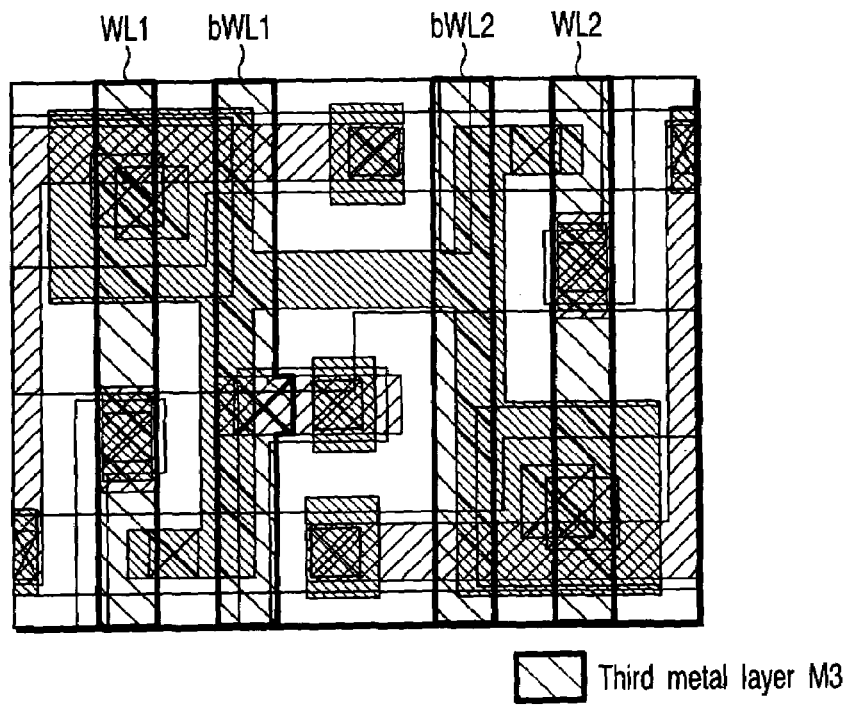
FIG. 18 is a plan diagram showing a layout of a cell unit according to the third embodiment.

The third metal layer M3 is formed on the second metal layer M2. A layout of the third metal layer M3 is as shown in FIG. 18.

The word lines WL1, WL2, bWL1, and bWL2 are formed in the third metal layer M3. The word line WL1 is connected to the gate electrode G of the N channel MOS transistor TN1, and the word line WL2 is connected to the gate electrode G of the N channel MOS transistor TN2. The word line bWL1 is connected to the gate electrode G of the P channel MOS transistor TP1, and the word line bWL2 is connected to the gate electrode G of the P channel MOS transistor TP2.

It is to be noted that the gates of the MOS transistors TN1, TN2, TP1, and TP2 are shared by the cells of a direction in which the word lines WL1, WL2, bWL1 and bWL2 are extended.

Accordingly, contact between the word lines WL1, WL2, bWL1 and bWL2 and the gates of the MOS transistors TN1, TN2, TP1 and TP2 only needs to be made in one of two adjacent blocks in the extended direction of the word lines WL1, WL2, bWL1 and bWL2.

Here, contact between the N and P channel MOS transistors TN1, TN2 and TP2 is made in a block shown in FIG. 15. However, contact of the P channel MOS transistor TP1 is not shown because it is made in a block adjacent to the block shown in FIG. 15.

Four layouts constituted of the foregoing two types of cell units are serially arrayed to form eight cell units. Thus, a TC parallel unit serial connection type ferroelectric memory having a CMOS type cell transistor similar to that shown in FIG. 3 can be provided.

As described above, in the layout of the third embodiment, by using the first and second metal layers M1, M2, it is possible to form a cell unit in which the P channel MOS transistors TPi, the N channel MOS transistors TNi, and the ferroelectric capacitors CFi are connected in parallel. Furthermore, the word lines WLi, bWLi are formed in the third metal layer M3.

Thus, it is possible to realize a TC parallel unit serial connection type ferroelectric memory having a CMOS type cell transistor in which a cell size increase is limited to a minimum.

(4) Fourth Embodiment

Figure 19:
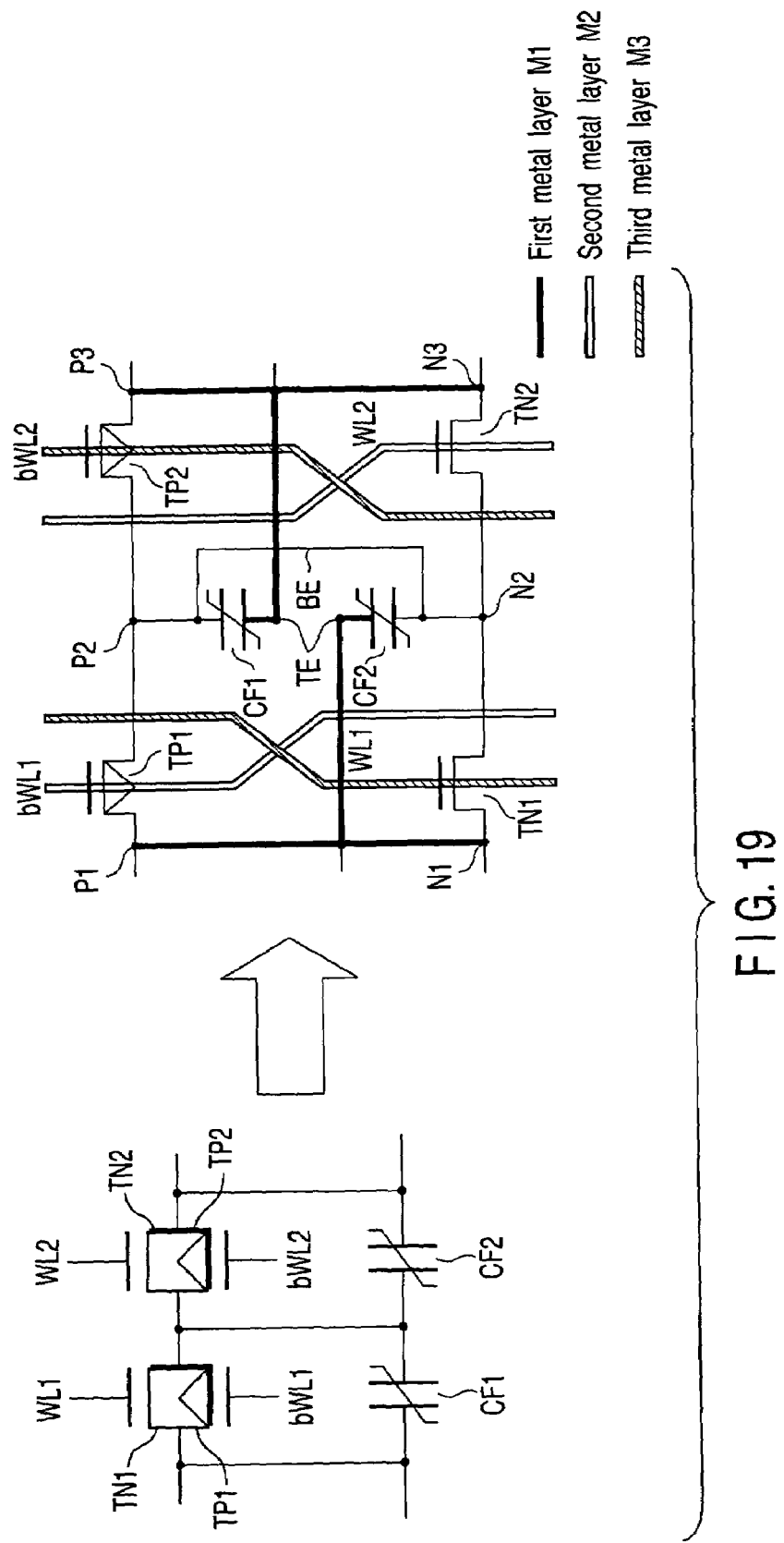
FIG. 19 is a circuit diagram showing an outline of a layout according to a fourth embodiment.

FIG. 19 shows an outline of a layout of memory cells of a TC parallel unit serial connection type ferroelectric memory according to a fourth embodiment.

The embodiment shows only two cell units (TC parallel units). However, when the number of cell units exceeds two, the same pattern is repeated. For example, nodes P3, N3 in the drawings are set to nodes P1, N1, and cell units can be increased one by one in order of nodes P1, N1→nodes P2, N2→nodes P3, N3.

A first cell unit comprises an N channel MOS transistor TN1, a P channel MOS transistor TP1, and a ferroelectric capacitor CF1. A second cell unit comprises an N channel MOS transistor TN2, a P channel MOS transistor TP2, and a ferroelectric capacitor CF2.

The N channel MOS transistors TN1, TN2 are serially connected, and the P channel MOS transistors TP1, TP2 are serially connected.

One end of the N channel MOS transistor TN1 becomes a node N1 (N1 node), and the other end becomes a node N2 (N2 node). One end of the N channel MOS transistor TN2 becomes a node N2, and the other end becomes a node N3 (N3 node). One end of the P channel MOS transistor TP1 becomes a node P1 (P1 node), and the other end becomes a node P2 (P2 node). One end of the P channel MOS transistor TP2 becomes a node P2, and the other end becomes a node P3 (P3 node).

The nodes P1, N1 and one end (upper electrode) TE of the ferroelectric capacitor CF2 are electrically connected to each other through a first metal layer (first wiring layer) M1. The nodes P3, N3 and one end (upper electrode) TE of the ferroelectric capacitor CF1 are electrically connected to each other through the first metal layer M1.

The other ends (lower electrodes) BE of the ferroelectric capacitors CF1, CF2 are electrically connected to the nodes P2, and N2. Here, the embodiment has a feature that the ferroelectric capacitors CF1, CF2 share one lower electrode BE.

Word lines bWL1, WL2 are formed in the second metal layer M2. The word line bWL1 is connected to a gate of the P channel MOS transistor TP1, and the word line WL2 is connected to a gate of the N channel MOS transistor TN2.

Word lines WL1, bWL2 are formed in a third metal layer M3. The word line WL1 is connected to a gate of the N channel MOS transistor TN1, and the work line bWL2 is connected to a gate of the P channel MOS transistor TP2.

According to the embodiment, the word lines bWL1, WL2 are formed in the second metal layer M2, and the word lines WL1, bWL2 are formed in the third metal layer M3. Instead, however, the word lines WL1, bWL2 may be formed in the second metal layer M2, and the word lines bWL1, WL2 may be formed in the third metal layer M3.

According to the embodiment, the word lines WL1, WL2 can be formed in the second metal layer M2. The word lines bWL1, bWL2 can be formed in the third metal layer M3. The word lines bWL1, bWL2 can be formed in the second metal layer M2, and the word lines WL1, WL2 can be formed in the third metal layer M3.

FIGS. 20 to 23 show layouts when the circuit diagram of FIG. 19 is realized on a semiconductor substrate.

FIGS. 20 to 23 show the same portion which is divided for each wiring layer to facilitate understanding of the layouts of the memory cells of the embodiment.

Figure 20:
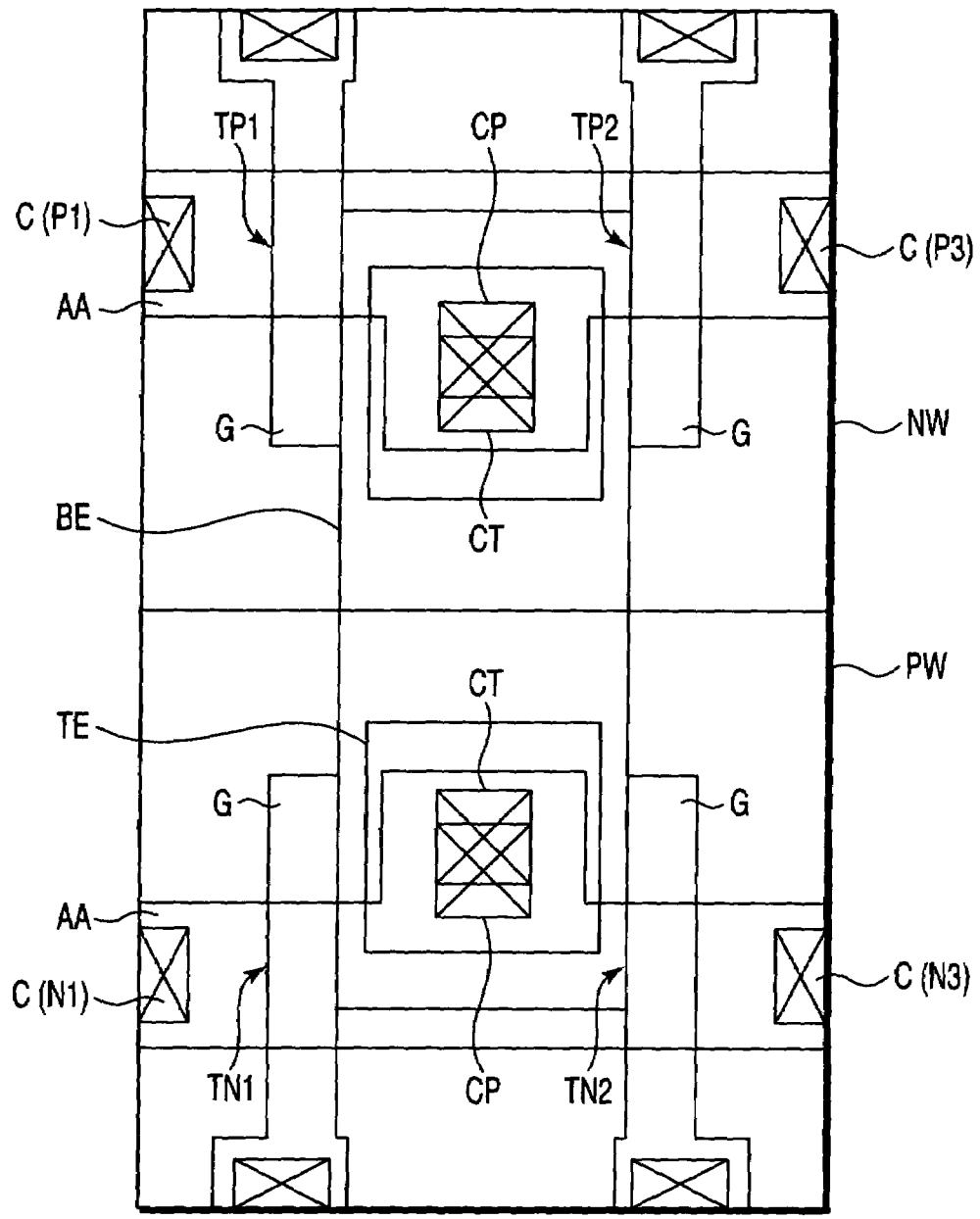
FIG. 20 is a plan diagram showing a layout of a cell unit according to the fourth embodiment.

To begin with, a layout in a state in which a polysilicon layer is formed as a gate of a MOS transistor is as shown in FIG. 20.

An N well region NW and a P well region PW are formed on a semiconductor substrate. The N and P well regions NW and PW are divided into element areas (active areas) AA and other element separation areas.

In the element area AA, the N channel MOS transistors TN1, TN2, and the P channel MOS transistors TP1, TP2 are formed.

The N channel MOS transistors TN1, TN2 comprise an N type diffusion layer and gate electrodes G formed in the element area AA. Contact plugs C(N1), C(N3) are formed on the N type diffusion layer. It is to be noted that N1, N3 in the brackets of the C(N1), the C(N3) correspond to the nodes N1, N3 in FIG. 19.

The P channel MOS transistor TP1, TP2 comprise a P type diffusion layer and gate electrodes G formed in the element area AA. Contact plugs C(P1), C(P3) are formed on the P type diffusion layer. It is to be noted that P1, P3 in the brackets of the C(P1), the C(P3) correspond to the nodes P1, P3 in FIG. 19.

The gate electrode G comprises a conductive polysilicon layer containing impurities.

Each of the ferroelectric capacitors CF1, CF2 comprises a lower electrode BE, an upper electrode TE, and a ferroelectric FE arranged therebetween.

According to the embodiment, the lower electrodes BE of the ferroelectric capacitors CF1, CF2 are integrated, and constituted of one conductive layer (metal plate). The lower electrode BE is connected through the contact plug CP to the P type diffusion layer (node P2) and the N type diffusion layer (node N2) in the element area AA.

On the upper electrode TE of each of the ferroelectric capacitors CF1, CF2, a contact plug CT is formed to contact the first metal layer M1 (described later).

Figure 21:
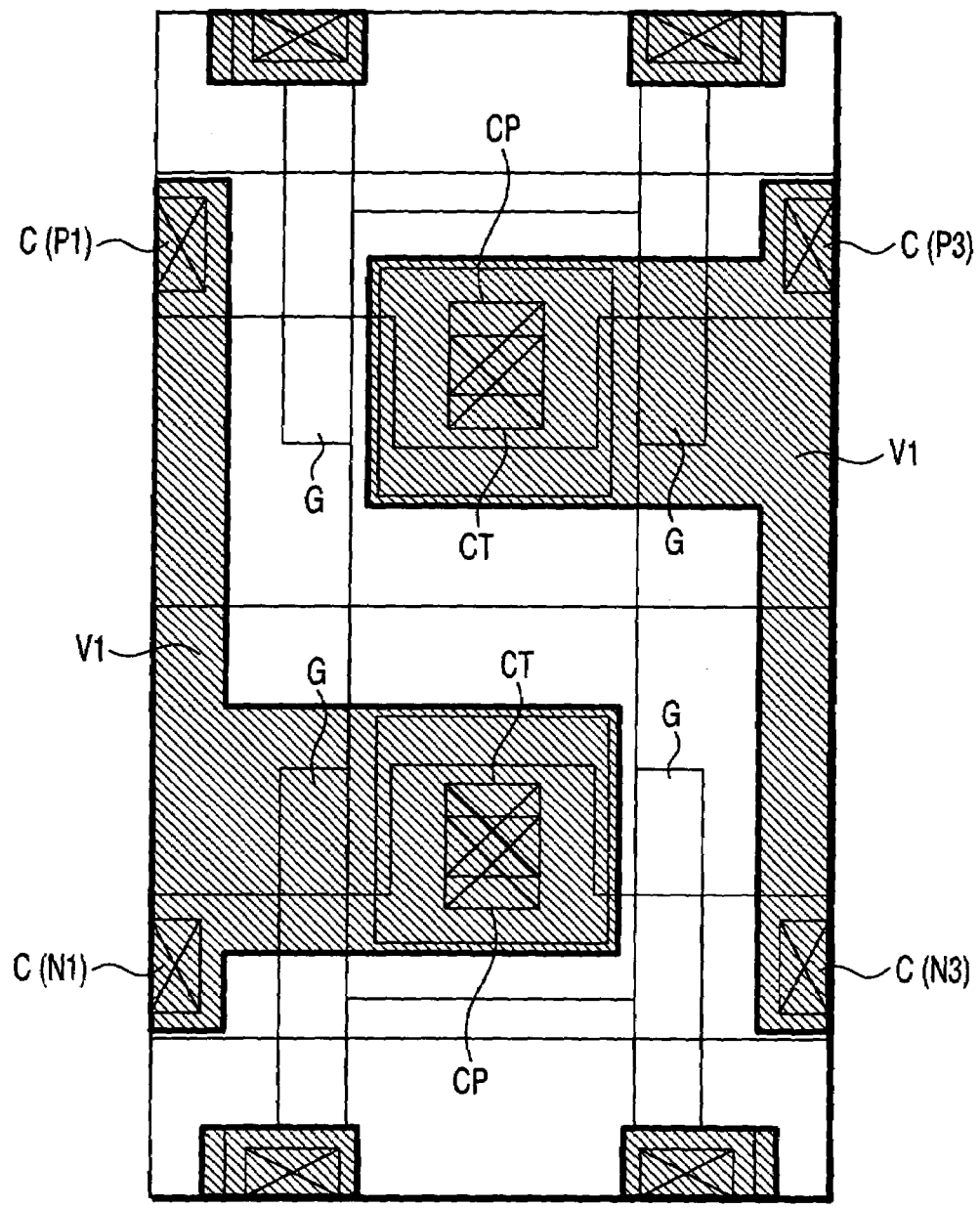
FIG. 21 is a plan diagram showing a layout of a cell unit according to the fourth embodiment.

The first metal layer M1 is formed on the layout of FIG. 20. A layout of the first metal layer M1 is as shown in FIG. 21.

In the first metal layer M1, a wiring V1 for electrically interconnecting the contact plugs C(P1), C(N1) and the contact plug CT connected to the ferroelectric capacitor CF2 is formed. In the first metal layer M1, a wiring V1 for electrically interconnecting the contact plugs C(P3), C(N3) and the contact plug CT connected to the ferroelectric capacitor CF1 is formed.

Additionally, in the first metal layer M1, an intermediate layer connected to the gate electrode G is formed.

Figure 22:
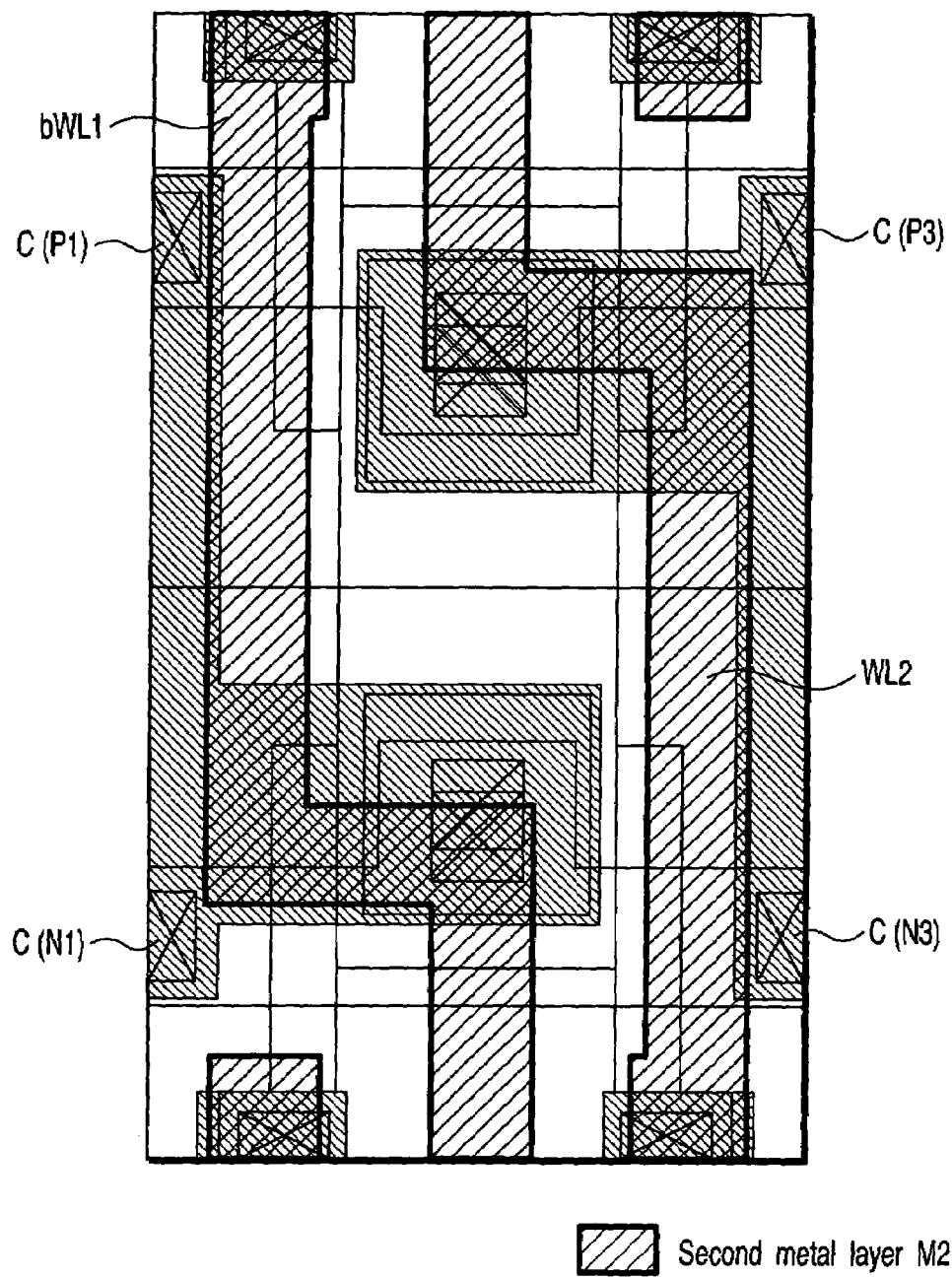
FIG. 22 is a plan diagram showing a layout of a cell unit according to the fourth embodiment.

The second metal layer M2 is formed on the first metal layer M1. A layout of the second metal layer M2 is as shown in FIG. 22.

In the second metal layer M2, the word lines bWL1, WL2 are formed. The word line bWL1 is connected to the gate electrode G of the P channel MOS transistor TP1, and the word line WL2 is connected to the gate electrode G of the N channel MOS transistor TN2. In the second metal layer M2, an intermediate layer connected to the gate electrodes G of the N and P channel MOS transistors TN1, TP2 is formed.

Figure 23:
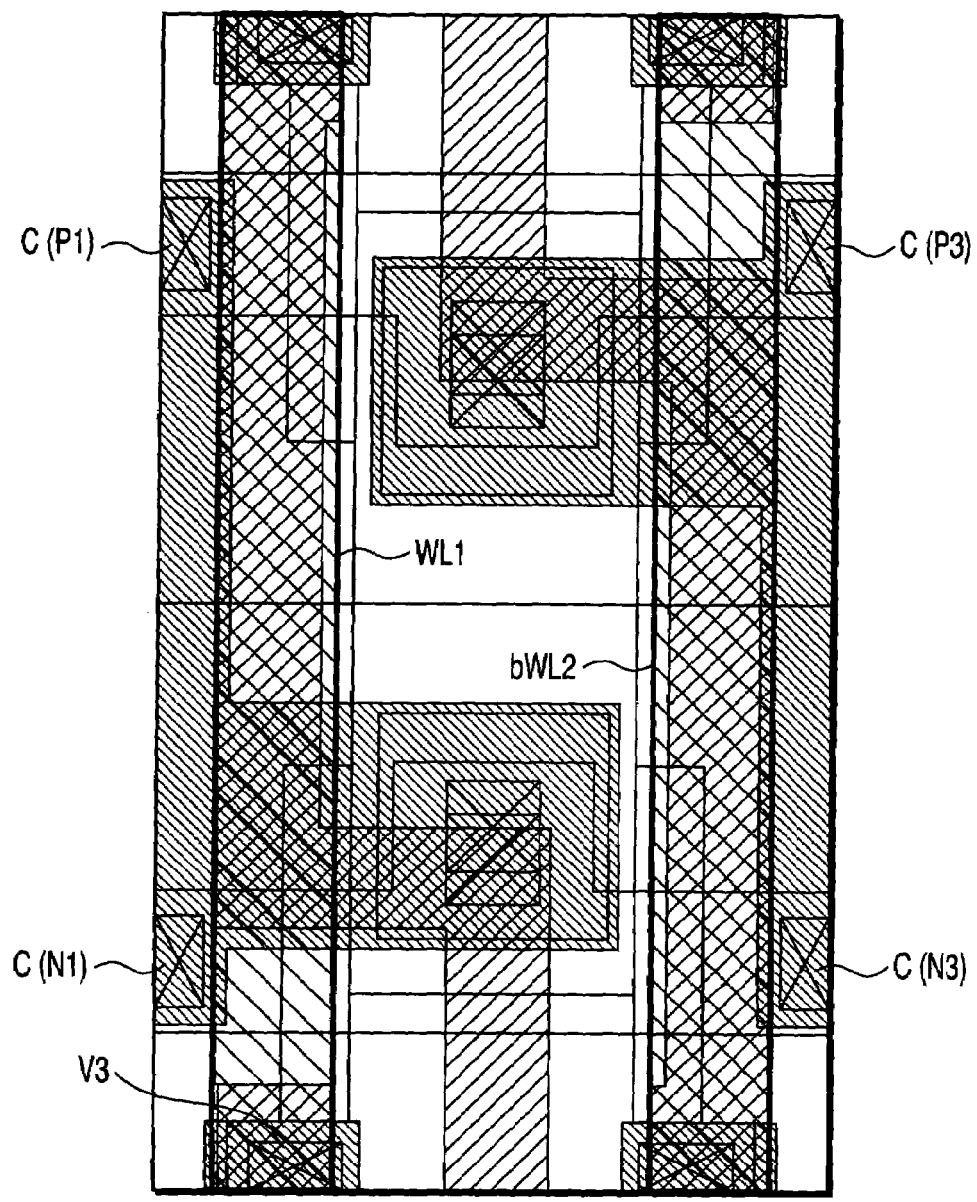
FIG. 23 is a plan diagram showing a layout of a cell unit according to the fourth embodiment.

The third metal layer M3 is formed on the second metal layer M2. A layout of the third metal layer M3 is as shown in FIG. 23.

The word lines WL1, bWL2 are formed in the third metal layer M3. The word line WL1 is connected to the gate electrode G of the N channel MOS transistor TN1, and the word line bWL2 is connected to the gate electrode G of the P channel MOS transistor TP2.

Four layouts constituted of the foregoing two types of cell units are serially arrayed to form eight cell units. Thus, a TC parallel unit serial connection type ferroelectric memory having a CMOS type cell transistor similar to that shown in FIG. 3 can be provided.

As described above, in the layout of the fourth embodiment, the lower electrode BE of the ferroelectric capacitors in the two cell units is shared, and the P channel MOS transistor TPi, the N channel MOS transistor TNi, and the ferroelectric capacitors CFi are connected in parallel by using the first metal layer M1. In this case, the lower electrode BE of the ferroelectric capacitor has a function of electrically interconnecting the nodes P2, N2 together with a function as a capacitor electrode. The word lines WLi, bWLi are formed in the second and third metal layers M2, M3.

Thus, it is possible to realize a TC parallel unit serial connection type ferroelectric memory having a CMOS type cell transistor in which a cell size increase is limited to a minimum.

3. Others

According to the embodiments of the present invention, the CMOS type cell transistor is employed. Thus, no deterioration occurs in the transfer function of the unselected cell transistor even without setting a high potential of the unselected word line. In other words, during reading, there is no so-called threshold reduction. Thus, potentials of the two diffusion layers of the cell transistor are equal, making it possible to prevent application of unnecessary stress on the ferroelectric capacitor.

Accordingly, a low voltage, a high speed, and high reliability can be realized. Simultaneously, because a boosting circuit is unnecessary, designing of a peripheral circuit can be facilitated and its area can be reduced.

According to the embodiments, even when the aforementioned CMOS type transistor is employed, by employing the layouts of the memory cells of the first to fourth embodiments, the area of the memory cell array is not enlarged. For example, according to the layout of the invention, a cell size equal to that of an SRAM, i.e., about 1.11 $\mu m^2$, can be realized.

Thus, according to the embodiments of the invention, it is possible to realize a TC parallel unit serial connection type ferroelectric memory operable by a low voltage and small in cell size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A ferroelectric memory comprising:
a first N channel MOS transistor connected between N1 and N2 nodes;
a second N channel MOS transistor connected between the N2 node and an N3 node;
a first P channel MOS transistor connected between P1 and P2 nodes;
a second P channel MOS transistor connected between the P2 node and a P3 node;
a first wiring formed in a first wiring layer to interconnect the N1 node and the P1 node;
a second wiring formed in the first wiring layer to interconnect the N3 node and the P3 node;
a third wiring formed in a second wiring layer different from the first wiring layer to interconnect the N2 node and the P2 node;
a first ferroelectric capacitor whose first electrode is connected to the first wiring; and
a second ferroelectric capacitor whose first electrode is connected to the second wiring,
wherein second electrodes of the first and second ferroelectric capacitors are both connected to the N2 node or the P2 node.

2. The ferroelectric memory according to claim 1, wherein the second wiring layer is formed on the first wiring layer.

3. The ferroelectric memory according to claim 1, wherein the other ends of the first and second ferroelectric capacitors are connected to the N2 node or the P2 node through a diffusion layer in a semiconductor substrate.

4. The ferroelectric memory according to claim 1, further comprising:
a first word line formed in the second wiring layer and connected to a gate of the first P channel MOS transistor; and
a second word line formed in the second wiring layer and connected to a gate of the second P channel MOS transistor.

5. The ferroelectric memory according to claim 4, further comprising:
a third word line formed in a third wiring layer on the second wiring layer and connected to a gate of the first N channel MOS transistor; and
a fourth word line formed in the third wiring layer and connected to a gate of the second N channel MOS transistor.

* * * * *